(12) United States Patent
Suzuki

(10) Patent No.: US 8,076,982 B2
(45) Date of Patent: Dec. 13, 2011

(54) VOLTAGE-CONTROLLED VARIABLE FREQUENCY OSCILLATION CIRCUIT AND SIGNAL PROCESSING CIRCUIT

(75) Inventor: Norihito Suzuki, Kanagawa (JP)

(73) Assignee: Sony Corporation, Tokyo (JP)

( * ) Notice: Subject to any disclaimer, the term of this patent is extended or adjusted under 35 U.S.C. 154(b) by 66 days.

(21) Appl. No.: 12/405,712

(22) Filed: Mar. 17, 2009

(65) Prior Publication Data

US 2009/0251228 A1    Oct. 8, 2009

(30) Foreign Application Priority Data

Apr. 3, 2008   (JP) ................................. 2008-097064

(51) Int. Cl.
*H03B 5/12* (2006.01)
(52) U.S. Cl. .................... 331/117 FE; 331/109; 331/183
(58) Field of Classification Search .............. 331/117 R, 331/117 FE, 167, 34, 177 R, 36 C, 177 V, 331/182, 183, 109
See application file for complete search history.

(56) References Cited

U.S. PATENT DOCUMENTS

| | | | |
|---|---|---|---|
| 6,680,655 B2 * | 1/2004 | Rogers | 331/109 |
| 7,301,414 B2 * | 11/2007 | Hino | 331/179 |
| 7,915,966 B2 * | 3/2011 | Tokuyama | 331/117 R |
| 2003/0025566 A1 | 2/2003 | Rogers | |
| 2004/0251977 A1 * | 12/2004 | Bellaouar et al. | 331/117 R |
| 2005/0017813 A1 | 1/2005 | Rana et al. | |
| 2005/0190002 A1 | 9/2005 | Takinami et al. | |
| 2006/0132253 A1 * | 6/2006 | Gelhausen et al. | 331/167 |
| 2007/0040625 A1 | 2/2007 | Yu et al. | |
| 2007/0132522 A1 * | 6/2007 | Lee et al. | 331/167 |
| 2009/0146752 A1 * | 6/2009 | O'Day et al. | 331/176 |
| 2009/0231051 A1 * | 9/2009 | Tokuyama | 331/117 R |

FOREIGN PATENT DOCUMENTS

| | | |
|---|---|---|
| JP | 52-074263 | 6/1977 |
| JP | 2004-147310 | 5/2004 |
| JP | 2004-266571 | 9/2004 |
| JP | 2005-236959 | 9/2005 |
| JP | 2006-086740 | 3/2006 |
| JP | 2006-197571 | 7/2006 |
| JP | 2007-028613 | 2/2007 |
| JP | 2007-300623 | 11/2007 |
| JP | 2008-053784 | 3/2008 |

OTHER PUBLICATIONS

Nederland Search Report (No. 136644/NL 1036799) issued on Oct. 29, 2009.
Japanese Office Action dated Mar. 29, 2011 for corresponding Japanese application 2008-097064.

* cited by examiner

*Primary Examiner* — Ryan Johnson
(74) *Attorney, Agent, or Firm* — K&L Gates LLP

(57) ABSTRACT

A voltage-controlled variable frequency oscillation circuit, includes: an oscillation circuit section including a resonance circuit which includes a coil and a variable capacitance element, and a negative resistance circuit; and a first resistor connected between the oscillation circuit section and a first one of a pair of terminals of a power supply.

16 Claims, 14 Drawing Sheets

PRIOR ART

PRIOR ART

VOLTAGE-CONTROLLED VARIABLE FREQUENCY OSCILLATION CIRCUIT AND SIGNAL PROCESSING CIRCUIT

CROSS REFERENCES TO RELATED APPLICATIONS

The present application claims priority to Japanese Patent Application JP 2008-097064, filed in the Japan Patent Office on Apr. 3, 2008, the entire contents of which is being incorporated herein by reference.

BACKGROUND

The present application relates to a voltage-controlled variable frequency oscillation circuit and a signal processing circuit which uses an oscillation frequency signal from a voltage-controlled variable frequency oscillation circuit to carry out a predetermined signal process.

As a voltage-controlled variable frequency oscillation circuit (hereinafter referred to sometimes as VCO (Voltage Controlled Oscillator)), a VCO of the LC resonance type wherein a coil and a variable capacitance element are used for a resonance circuit is used popularly.

An example of a conventional VCO of the LC resonance type is shown in FIG. 14. Referring to FIG. 14, the VCO shown includes an oscillation circuit section 103 which includes a resonance circuit 101 and a negative resistance circuit 102. The oscillation circuit section 103 is directly connected to a power supply line 104 to which a power supply potential VDD is supplied, and the negative resistance circuit 102 is biased by a current source 105.

The resonance circuit 101 includes a pair of coils L1 and L2 and a variable capacitance circuit 110. The variable capacitance circuit 110 in the configuration shown in FIG. 14 includes two varactors 111 and 112 as variable capacitance elements.

As a varactor which can be used for the varactors 111 and 112, varactors of various configurations are available, and at least two different configurations of varactors are available. A varactor of one of the configurations is shown in FIG. 15A.

Referring to FIG. 15A, each of the varactors 111 and 112 is formed from a MOSFET (Metal Oxide Semiconductor Field Effect Transistor) 106 whose source and drain are connected to each other. As shown in FIG. 15A, a terminal 106a is led out from a connecting point of the source and the drain of the MOSFET 106, and the other terminal 106b is led out from the gate of the MOSFET 106.

Another example of a configuration of a varactor uses a MOS structure which uses the gate terminal and the well terminal.

Although any of the varactors can be used for the LC resonance circuit, it is assumed that, in the following description, a varactor of the configuration described above with reference to FIG. 15A is used for the convenience of description.

If a controlling voltage VG is applied between the terminals 106a and 106b, then the varactor exhibits a capacitance value C in accordance with the controlling voltage VG as seen in FIG. 15B. Accordingly, the capacitance value C can be varied by varying the controlling voltage VG, and the VCO varies the oscillation output frequency thereof in response to the variation of the capacitance value C.

In the variable capacitance circuit 110 of FIG. 14, the varactors 111 and 112 are connected at one terminal thereof, that is, at the terminal 106a side thereof, to each other, and a controlling voltage VC is connected to a connecting point P0 between them. The varactor 111 is connected at the opposite terminal thereof, that is, at the terminal 106b thereof, to the power supply line 104 through the coil L1, and the other varactor 112 is connected at the opposite terminal thereof, that is, at the terminal 106b thereof, to the power supply line 104 through the coil L2.

The negative resistance circuit 102 in FIG. 14 is formed from a differential circuit of a pair of MOSFETs 121 and 122. In particular, the MOSFETs 121 and 122 are connected at the source thereof to each other, and the connecting point between them is grounded through the current source 105. Further, the drain of the MOSFET 121 and the gate of the MOSFET 122 are connected to each other, and the connecting point between them is connected to a connecting point P1 between the coil L1 and the varactor 111. Furthermore, the drain of the MOSFET 122 and the gate of the MOSFET 121 are connected to each other, and the connecting point between them is connected to a connecting point P2 between the coil L2 and the varactor 112.

In the VCO of FIG. 14, the oscillation circuit section 103 is connected directly to the power supply line 104 to which the power supply potential VDD is supplied. Therefore, the dc (direct-current) potential difference between the opposite terminals of the variable capacitance circuit 110, that is, between the connecting points P1 and P2, is substantially equal to the power supply potential VDD, and the capacitance variation region by the varactors 111 and 112 cannot be used effectively. As a result, there is a problem that the frequency variation region of the VCO cannot be increased.

A case is studied here wherein, in FIG. 15A, the potential at the terminal 106a is represented by Va and the potential at the terminal 106b is represented by Vb, and the potential Va is varied with reference to the potential Vb to vary the controlling voltage VG. In this instance, if the value of the potential Va is varied within the range of $Vb-\alpha<Va<Vb+\alpha$, then the controlling voltage VG assumes a value which satisfies $-\alpha<VG<\alpha$ as seen in FIG. 15B, and the capacitance value C exhibits an optimum variation range W0.

However, in the case of the VCO of FIG. 14, the potential at the opposite terminal side, that is, at the terminal 106b side, of the varactors 111 and 112, is the power supply potential VDD. Therefore, even if it is tried to use the controlling voltage VC to vary the potential on the first terminal side, that is, at the terminal 106a side, of the varactors 111 and 112, the controlling voltage VC cannot be made equal to or higher than the power supply potential VDD readily from a restriction of a driving circuit. The variation characteristic of the capacitance value C of the varactor with respect to the controlling voltage VC at this time is such as indicated by a solid line curve 201 of FIG. 16. As a result, there is a problem that the variation range of the capacitance value C of the variable capacitance circuit 110 becomes a variation range W1 very narrower than the optimum variation range W0 (refer to FIG. 15B) as seen in FIG. 16.

Against this problem, it is proposed in Japanese Patent Laid-Open No. 2004-147310 (hereinafter referred to as Patent Document 1) to use such a configuration as shown in FIG. 17 for the variable capacitance circuit 110 described above to increase the variation range of the capacitance value C of the variable capacitance circuit 110.

Referring to FIG. 17, a dc cutting capacitor 113 is connected between the varactor 111 and the connecting point P1 while another dc cutting capacitor 114 is connected between the varactor 112 and the connecting point P2. A connecting point between the varactor 111 and the capacitor 113 is connected to a dc bias potential VBIAS through a resistor 115 while a connecting point between the varactor 112 and the capacitor 114 is connected to the dc bias potential VBIAS through another resistor 116.

According to the configuration shown in FIG. 17, a bias voltage is supplied to the second terminal side, that is, to the terminal 106b side, of the varactors 111 and 112 through the resistors 115 and 116, respectively. Accordingly, the potential at the second terminal side, that is, at the terminal 106b side, of the varactor 111 and the varactor 112 becomes lower than the power supply potential VDD and can be reduced ideally to VDD/2.

Accordingly, the variation characteristic of the capacitance value C of the varactors 111 and 112 with respect to the controlling voltage VC when the controlling voltage VC supplied to the connecting point P0 of the varactors 111 and 112 is varied up to the power supply potential VDD becomes such as indicated by a solid line curve 202 in FIG. 16. As a result, the variation range of the capacitance value C of the variable capacitance circuit 110 becomes a wider variation range W2 as seen in FIG. 16, and a wider frequency range than that of the example of FIG. 14 can be achieved with the VCO.

SUMMARY

However, where the variable capacitance circuit 110 shown in FIG. 17 is used, the capacitors 113 and 114 are connected in series to the varactors 111 and 112, respectively. Therefore, the capacitance variation region of the variable capacitance circuit effectively decreases by an amount provided by the series connected capacitors 113 and 114.

As a result, the voltage-controlled oscillator of the configuration disclosed in Patent Document 1 suffers from a new problem that a wide frequency variation region corresponding to the capacitance variation region of a variable capacitance element cannot be assured.

Therefore, it is desirable to provide a voltage-controlled variable frequency oscillation circuit with which a wide frequency variation region in accordance with a capacitance variation region of a variable capacitance element can be assured.

According to an embodiment, there is provided a voltage-controlled variable frequency oscillation circuit including an oscillation circuit section including a resonance circuit which includes a coil and a variable capacitance element, and a negative resistance circuit, and a first resistor connected between the oscillation circuit section and a first one of a pair of terminals of a power supply.

In the voltage-controlled variable frequency oscillation circuit, since the first resistor is connected between the oscillation circuit section and the first one of the terminals of the power supply, the power supply potential is applied to the variable capacitance element of the resonance circuit through the first resistor. Meanwhile, a voltage lower than the power supply voltage is applied to one terminal of the variable capacitance element of the resonance circuit.

Accordingly, the capacitance of the variable capacitance element which is varied by the controlling voltage supplied to the second terminal of the variable resistance element varies over a variation range greater than that of the existing voltage-controlled variable frequency oscillation circuit described hereinabove with reference to FIG. 14.

Further, in the voltage-controlled variable frequency oscillation circuit of the present embodiment, since such a series capacitance element as in the existing voltage-controlled variable frequency oscillation circuit is not provided for the variable capacitance element, the capacitance variation region by the variable capacitance element corresponds as it is to the variation region of the oscillation frequency. Consequently, a frequency variation region greater than that in the voltage-controlled variable frequency oscillation circuit described hereinabove with reference to FIG. 17 can be assured.

In summary, with the voltage-controlled variable frequency oscillation circuit, since the capacitance variation range of the variable capacitance circuit corresponds directly to the variable capacitance region of the variable capacitance element, a greater frequency variation region can be assured.

Additional features and advantages are described herein, and will be apparent from the following Detailed Description and the figures.

DETAILED DESCRIPTION

In the following, several voltage-controlled variable frequency oscillation circuits (VCOs) according to different embodiments are described with reference to the accompanying drawings. Incidentally, in the figures used for illustrating following embodiments, for simpler description, the same components with those of the VCO shown in FIG. 14 have the same numbers or symbols so as to omit their explanation.

First Embodiment

Figure 1:
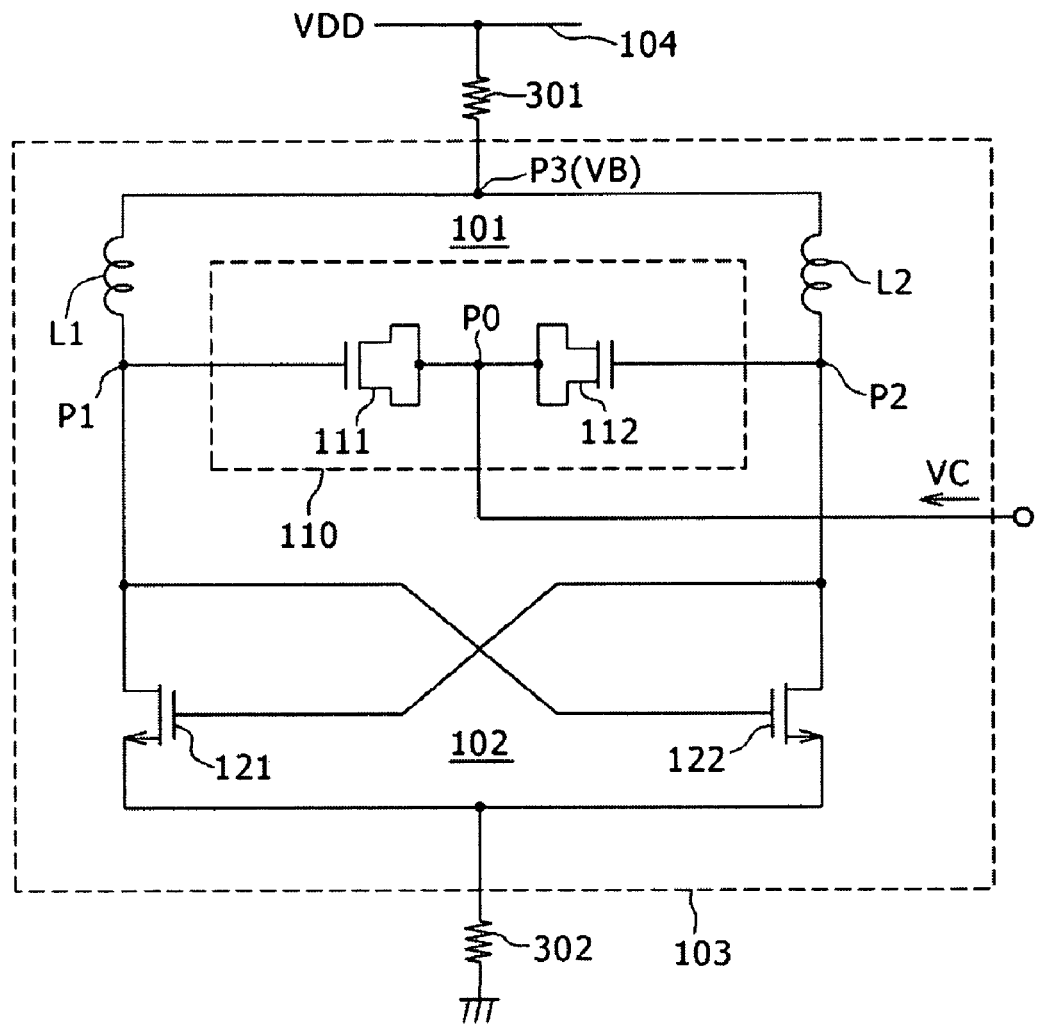
FIG. 1 is a circuit diagram showing a voltage-controlled variable frequency oscillation circuit according to a first embodiment.

FIG. 1 shows a VCO according to a first embodiment.

Referring to FIG. 1, the VCO shown includes a first resistor 301 between an oscillation circuit section 103 and a power supply line from which a power supply potential VDD is obtained. In particular, in the VCO shown in FIG. 1, the first resistor 301 is connected between a connecting point P3 (potential VB) of a coil L1 and another coil L2 and a power supply line 104 connected to a first terminal or a second terminal of a power supply.

A second resistor 302 is provided between the oscillation circuit section 103 and a ground potential terminal which is the second terminal or the first terminal of the power supply. In other words, in the VCO of FIG. 1, the second resistor 302 is connected between the connecting point of the sources of the MOSFETs 121 and 122 and the ground terminal.

In the configuration of the VCO of the first embodiment shown in FIG. 1, a bias voltage is applied to the connecting points P1 and P2 which are the second terminal side, that is, the terminal 106b side, of the varactors 111 and 112 through the first resistor 301. Accordingly, the potential (substantially equal to the potential VB at the connecting point P3) on the second terminal side, that is, on the terminal 106b side, of the varactors 111 and 112 is lower than the power supply potential VDD.

Particularly in the VCO of the first embodiment, the bias voltage for the variable capacitance circuit 110 supplied to the connecting points P1 and P2 depends upon the resistance value of the first resistor 301 and the resistance value of the second resistor 302. Thus, by appropriately setting the resistance value of the first and second resistors 301 and 302, the bias voltage of the variable capacitance circuit 110 can be set to VDD/2 or a value proximate to VDD/2.

Figure 2:
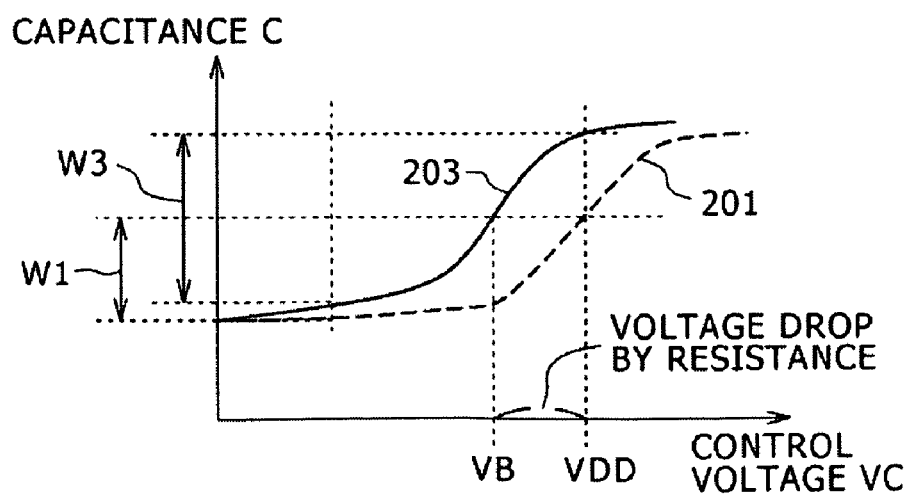
FIG. 2 is a diagram illustrating a control characteristic of the voltage-controlled variable frequency oscillation circuit of FIG. 1.

Accordingly, the variation characteristic of the capacitance value C of the varactors 111 and 112 with respect to the controlling voltage VC supplied to the connecting point P0 of the varactors 111 and 112 when the controlling voltage VC is varied up to the power supply potential VDD can be made a maximum range as indicated by a solid line curve 203 in FIG. 2. Since the variation range of the capacitance value C of the variable capacitance circuit 110 conforms to the capacitance variation range of the varactors 111 and 112, also this variation range increases. As a result, the frequency variation region of the VCO of the present embodiment can be set to a variation range W3 proximate to the optimum variation range W0.

Figure 14:
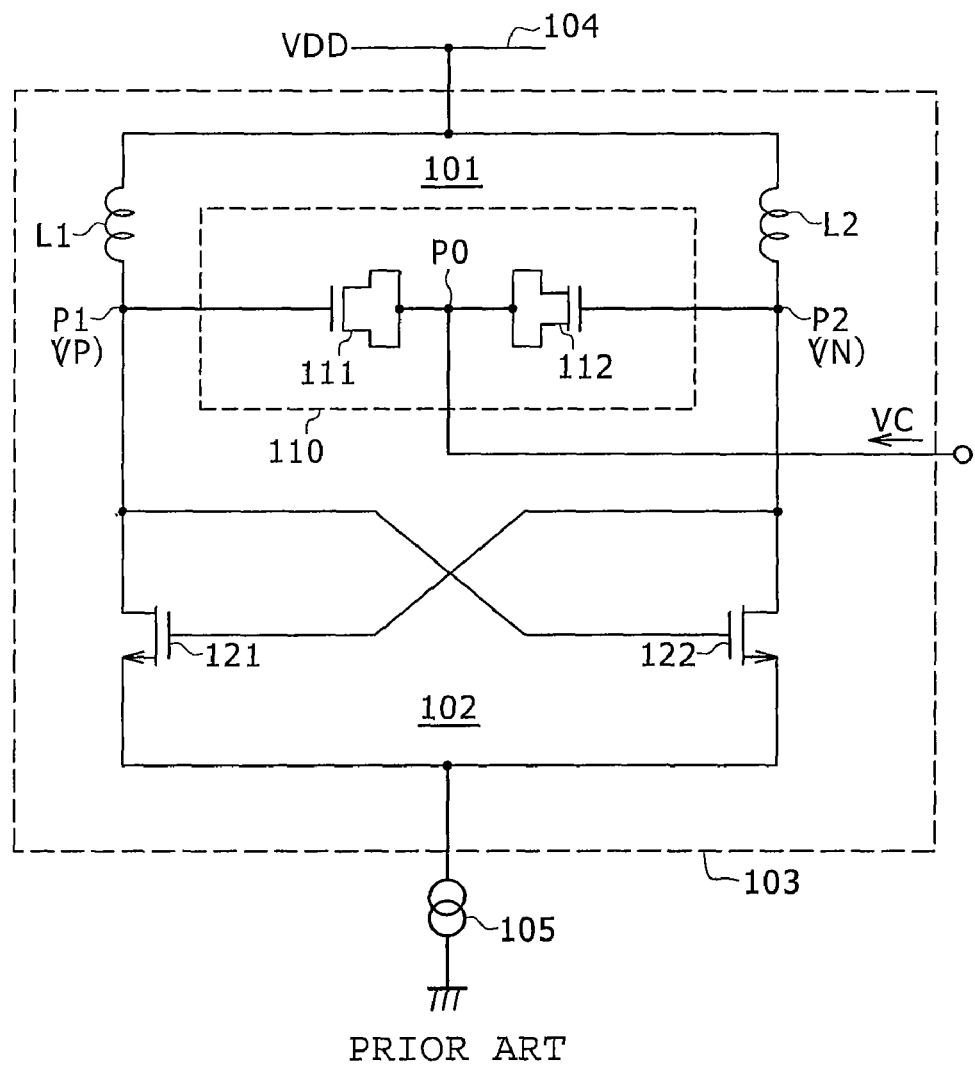
FIG. 14 is a circuit diagram showing an example of a circuit configuration of an existing voltage-controlled variable frequency oscillation circuit.
Figure 15A:
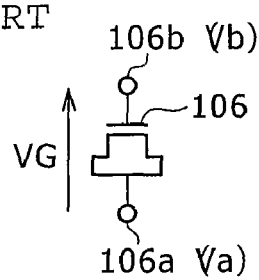
FIG. 15A is a schematic view showing a varactor as a variable capacitance element used in the voltage-controlled variable frequency oscillation circuit shown in FIG. 14
Figure 15B:
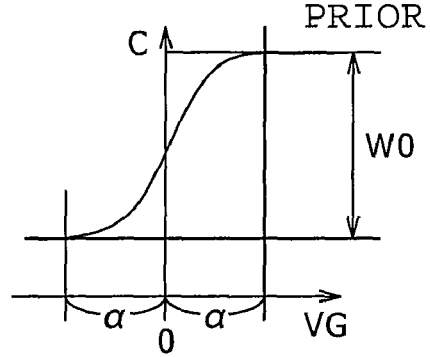
FIG. 15B is a diagram illustrating a characteristic of the varactor of FIG. 15A.
Figure 16:
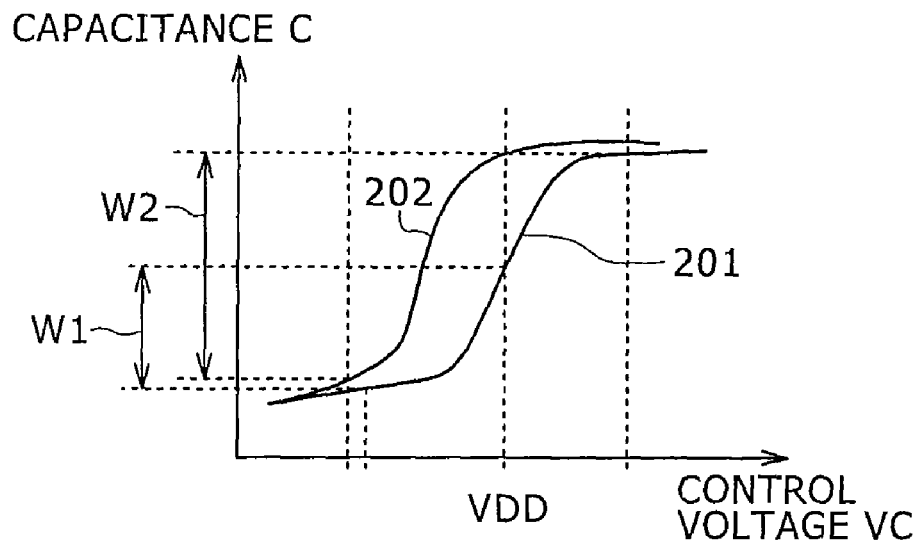
FIG. 16 is a diagram illustrating a characteristic of the existing voltage-controlled variable frequency oscillation circuit shown in FIG. 14.
Figure 17:
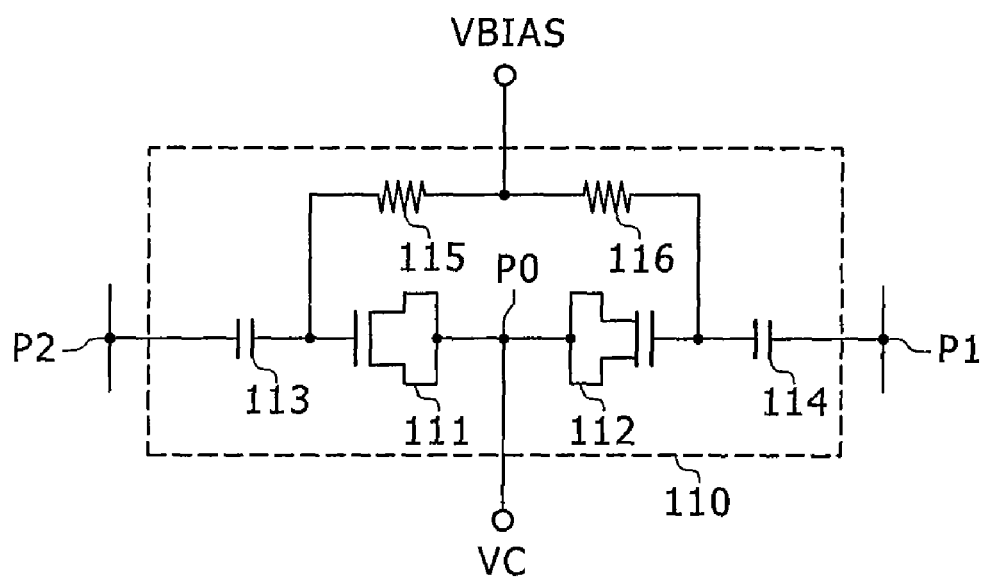
FIG. 17 is a circuit diagram showing an example of a circuit configuration of part of an improved existing voltage-controlled variable frequency oscillation circuit.

Further, in the existing VCO described hereinabove with reference to FIG. 14, since the current source is formed from a MOS transistor, flicker noise in low frequencies is very high and this deteriorates the phase noise characteristic of the oscillation frequency of the VCO significantly. In contrast, with the VCO of the present embodiment, since the second resistor 302 is connected in place of the current source, the phase noise characteristic is improved.

Second Embodiment

In the VCO of the LC resonance type, the capacitance of the variable capacitance circuit 110 is varied to vary the oscillation frequency of the VCO as described above. However, the resonance impedance of the resonance circuit 101 fluctuates in response to the variation of the oscillation frequency. Therefore, particularly in a low frequency region, the oscillation frequency of the oscillation output signal from the VCO drops, and the phase noise characteristic is deteriorated.

The VCO of the second embodiment is configured so as to solve the problem of the deterioration of the phase noise characteristic. An example of a configuration of the VCO of the second embodiment is shown in FIG. 3.

Figure 3:
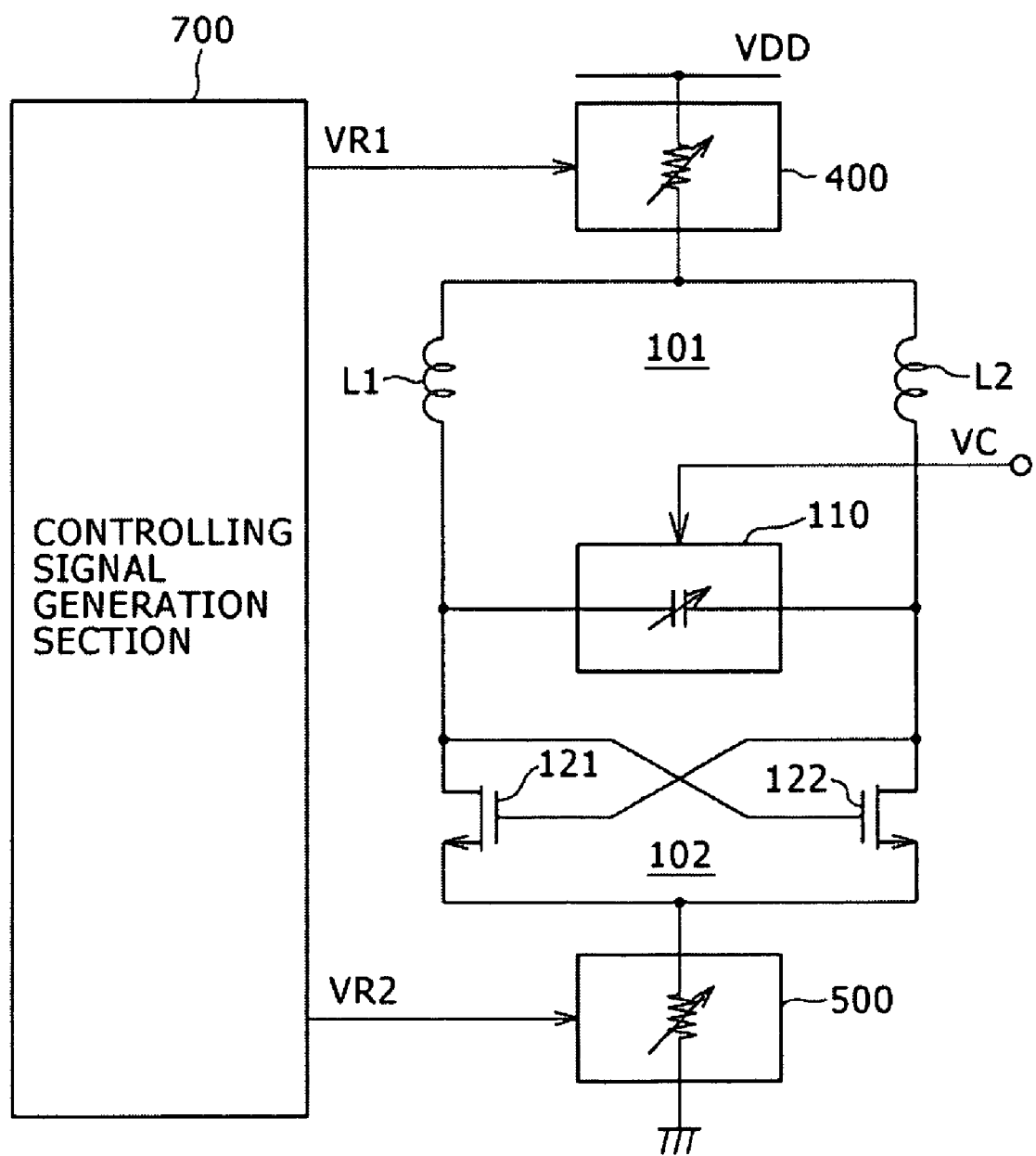
FIG. 3 is a circuit diagram showing a voltage-controlled variable frequency oscillation circuit according to a second embodiment.

Referring to FIG. 3, the VCO of the second embodiment is a modification to but is different from the VCO of the first embodiment in that a variable resistance circuit 400 is provided in place of the first resistor 301, and another variable resistance circuit 500 is provided in place of the second resistor 302. Further, controlling signals VR1 and VR2 corresponding to a controlling voltage VC for the variable capacitance circuit 110 are supplied from a controlling signal generation section 700 as resistance value controlling signals to the variable resistance circuits 400 and 500, respectively. The other components are configured similar to those of the VCO of the first embodiment described.

In the VCO of the second embodiment, when the oscillation frequency of the VCO varies in response to the controlling voltage VC, the controlling signal generation section 700 controls the resistance value of the variable resistance circuits 400 and 500 in response to the variation of the oscillation frequency. In this configuration, a bias current value to the variable capacitance circuit 110 in response to the oscillation frequency of the VCO is controlled, whereby the oscillation amplitude of the oscillation output signal of the VCO is prevented from deteriorating.

Accordingly, in the VCO of the second embodiment, deterioration of the phase noise characteristic by variation of the oscillation frequency of the VCO can be prevented.

The variable resistance circuits 400 and 500 can be formed, for example, from a variable resistance element for which a MOSFET is used or from a combination of a resistance element and a switch circuit. Also it is possible to use, for example, both of a variable resistance element for which a MOSFET is used and a combination of a resistance element and a switch circuit.

Figure 4:
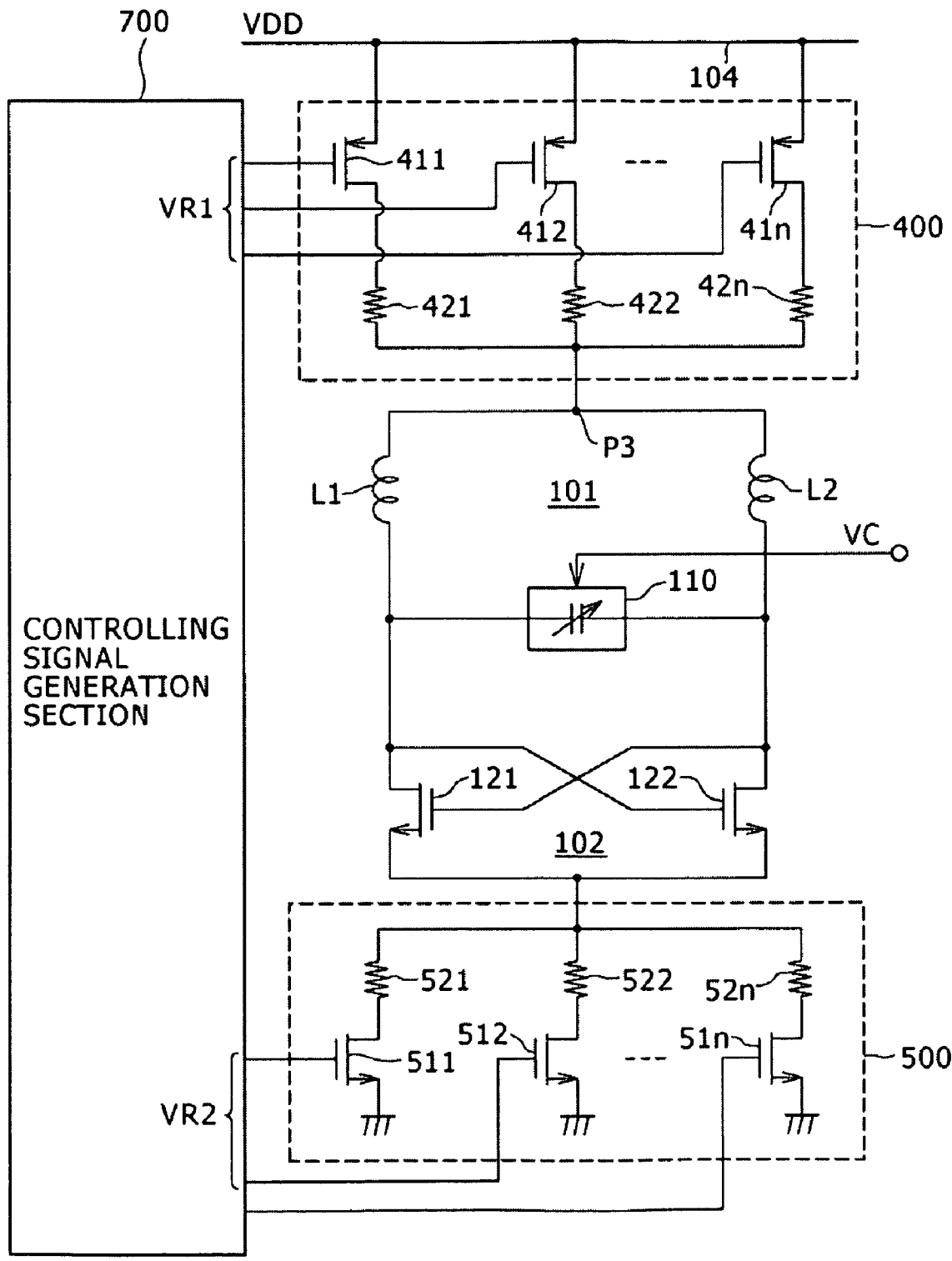
FIG. 4 is a connection diagram showing a particular example of a configuration of part of the voltage-controlled variable frequency oscillation circuit of FIG. 3.

FIG. 4 shows an example of a VCO wherein the variable resistance circuits 400 and 500 are formed from a combination of a resistance element and a switch circuit.

Referring to FIG. 4, the variable resistance circuit 400 includes a plurality of MOSFETs 411, 412, ..., 41n (n is an integer equal to or greater than 2: this similarly applies to the following description) serving as a switch circuit and resistors 421, 422, ..., 42n connected in series to the MOSFETs 411, 412, ..., 41n, respectively. The series connections of the MOSFETs 411, 412, ..., 41n and the resistors 421, 422, ..., 42n are connected in parallel between the connecting point P3 and the power supply line 104.

The controlling signal generation section 700 supplies an on/off switching control signal to be supplied to the gate of the MOSFETs 411, 412, ..., 41n as the controlling signal VR1 for resistance value control to the variable resistance circuit 400.

Similarly, the variable resistance circuit 500 includes a plurality of MOSFETs 511, 512, ..., 51n serving as a switch circuit and resistors 521, 522, ..., 52n connected in series to the MOSFETs 511, 512, ..., 51n, respectively. The series connections of the MOSFETs 511, 512, ..., 51n and the resistors 521, 522, ..., 52n are connected in parallel between the connecting point of the sources of the MOSFETs 121 and 122 of the negative resistance circuit 102 and the ground terminal.

The controlling signal generation section 700 supplies an on/off switching control signal to be supplied to the gate of the MOSFETs 511, 512, ..., 51n as the controlling signal VR2 for resistance value control to the variable resistance circuit 500.

In the variable resistance circuit 400, the resistors connected in series to those ones of the MOSFETs 411, 412, ..., 41n which are controlled to an on state are connected in parallel between the connecting point P3 and the power supply line. Accordingly, the number of resistors which are to be connected in parallel is varied by on/off control of the MOSFETs 411, 412, ..., 41n and the resistance value of the entire variable resistance circuit 400 is varied thereby.

Similarly, in the variable resistance circuit 500, the resistors connected in series to those ones of the MOSFETs 511, 512, ..., 51n which are controlled to an on state are connected in parallel between the negative resistance circuit and the ground terminal. Accordingly, the number of resistors which are to be connected in parallel is varied by on/off control of the MOSFETs 511, 512, ..., 51n and the resistance value of the entire variable resistance circuit 500 is varied thereby.

Third Embodiment

Figure 5:
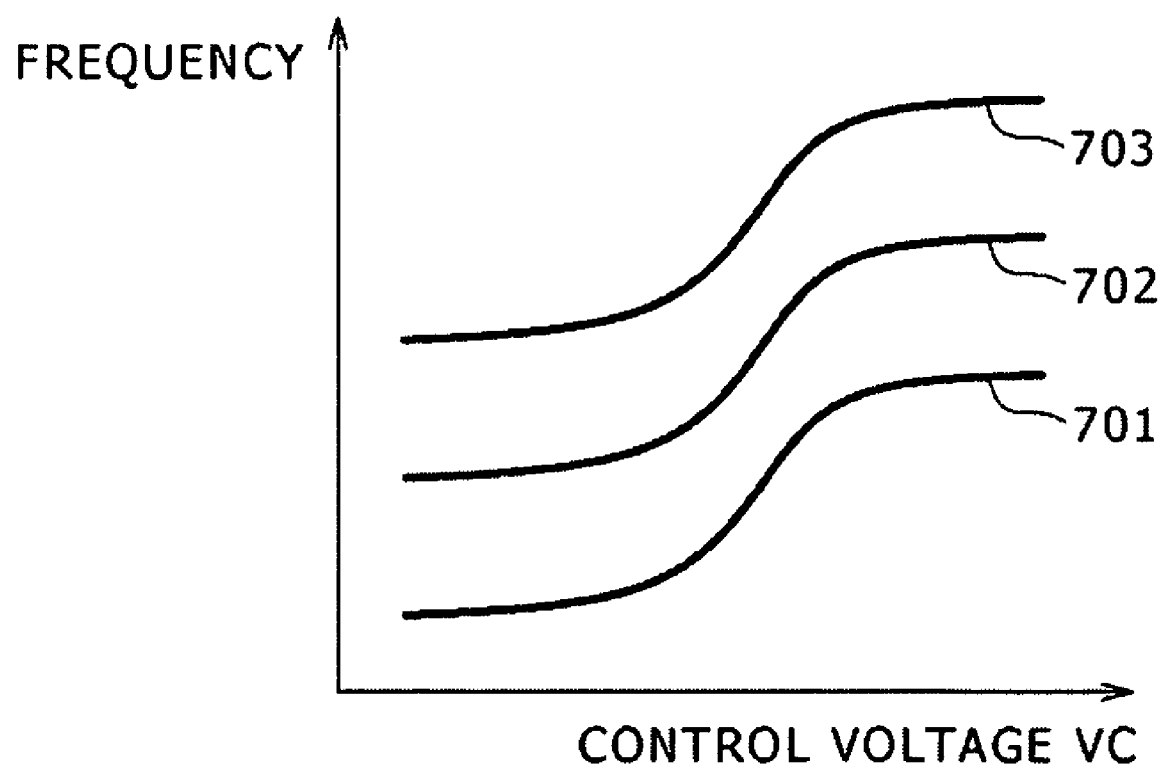
FIG. 5 is a diagram illustrating operation of a voltage-controlled variable frequency oscillation circuit according to a third embodiment.

In order to increase the frequency variation region of a VCO, frequently a countermeasure is taken wherein the oscillation center frequency of the VCO is shifted as seen from characteristic curves 701, 702 and 703 of FIG. 5. Also in this instance, it is necessary to take care so that, also in the shifted variable frequency range, the oscillation amplitude of the oscillation output signal from the VCO may not deteriorate.

Also in this instance, the resistance value of the variable resistance circuits 400 and 500 can be controlled to control the bias current value to the variable capacitance circuit 110 in response to the oscillation frequency of the VCO to prevent the oscillation amplitude of the oscillation output signal of the VCO from deteriorating.

Figure 6:
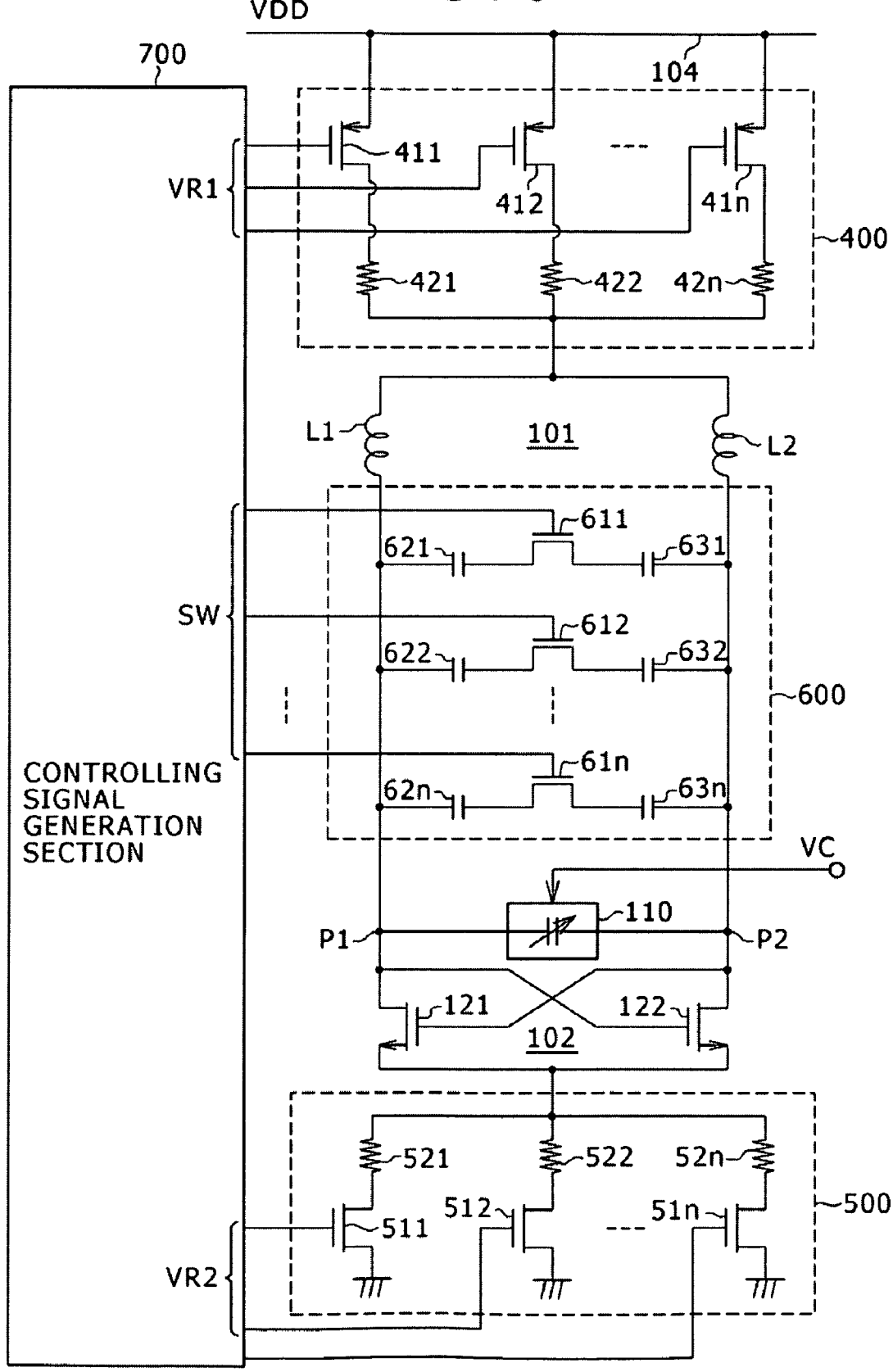
FIG. 6 is a circuit diagram showing the voltage-controlled variable frequency oscillation circuit according to the third embodiment.

The VCO according to the third embodiment is formed taking the foregoing into consideration, and an example of a configuration of the VCO of the third embodiment is shown in FIG. 6.

In the VCO of the third embodiment, the resonance circuit 101 includes a capacitance changeover circuit 600 connected in parallel to the variable capacitance circuit 110 between the variable capacitance circuit 110 and the coils L1 and L2 for shifting the oscillation center frequency.

The capacitance changeover circuit 600 is formed from a plurality of parallel connections of series circuits wherein a capacitor is connected between the source of a MOSFET which forms a switch circuit and the connecting point P1 and between the drain of the MOSFET and the connecting point P2.

In particular, capacitors 621, 622, ..., 62n are connected between the sources MOSFETs 611, 612, ..., 61n and the connecting point P1, respectively, and capacitors 631, 632, ..., 63n are connected between the drains of the MOSFETs 611, 612, ..., 61n and the connecting point P2, respectively.

The controlling signal generation section 700 supplies a switching controlling signal SW for on/off switching to the gate of the MOSFETs 611, 612, ..., 61n.

In the VCO having the configuration described above, if any of the MOSFETs 611, 612, ..., 61n is turned on by the switching control signal SW, then the capacitors connected on the opposite sides of the MOSFET are connected in series between the connecting point P1 and the connecting point P2.

Accordingly, the series circuits of the capacitors connected to the opposite sides only of those ones of the MOSFETs 611, 612, ..., 61n which are controlled to an on state by the switching control signal are connected in parallel to the variable capacitance circuit 110. In other words, the number of series circuits of the capacitors connected in parallel between the connecting point P1 and the connecting point P2 is varied in response to the switching controlling signal SW to the MOSFETs 611, 612, ..., 61n.

Consequently, the oscillation center frequency of the VCO is controlled to shift in response to the switching controlling signal SW to the MOSFETs 611, 612, ..., 61n.

In the VCO of the third embodiment, the controlling signal generation section 700 produces the controlling signals VR1 and VR2 so that variation control of the resistance value of the variable resistance circuits 400 and 500 is carried out in response to the shift control of the oscillation center frequency of the VCO in addition to the operation of the VCO of the second embodiment described hereinabove.

In the VCO of the third embodiment having the configuration described above, even when the variation frequency range of the VCO is shifted, the resistance value of the variable resistance circuits 400 and 500 is controlled in response to the shift, and consequently, the oscillation amplitude of the oscillation output signal from the VCO does not deteriorate. In other words, the oscillation amplitude of the oscillation output signal from the VCO can normally be kept substantially fixed within the overall variation frequency range for shifting.

It is to be noted that the VCO shown in FIG. 6 uses the variable resistance circuits 400 and 500 used in the VCO shown in FIG. 4. However, also in the VCO of the third embodiment, the variable resistance circuits 400 and 500 can be formed, for example, from a variable resistance element for which a MOSFET is used or from a combination of a resistance element and a switch circuit. Also it is possible for the variable resistance circuits 400 and 500 to use, for example, both of a variable resistance element for which a MOSFET is used and a combination of a resistance element and a switch circuit.

Fourth Embodiment

The fourth embodiment is an example wherein a VCO according to an embodiment is used as a variable frequency oscillation circuit of a PLL circuit of a tuner section or front end circuit of a television broadcasting signal receiving apparatus. In the present fourth embodiment, the front end circuit is formed as a one-chip IC.

As regards an IC circuit, where an internal component circuit includes a resistance element, the resistance element exhibits a dispersion for each IC. Therefore, preferably the VCO, for example, of the third embodiment described above is configured such that the resistors 421, 422, ..., 42n of the variable resistance circuit 400 and the resistors 521, 522, ..., 52n of the variable resistance circuit 500 can be adjusted against the dispersion for each IC.

Dispersion adjustment data for a VCO or some other circuit section which uses a resistance element for each front end circuit IC can be acquired before shipment from a factory, for example, using a tester. In the present fourth embodiment, a nonvolatile memory for storing such adjustment data is built in a front end circuit IC in advance, and adjustment data acquired using the tester described above are stored into the nonvolatile memory so that adjustment against a dispersion by resistance can be carried out.

Now, the fourth embodiment is described in detail.

Figure 7:
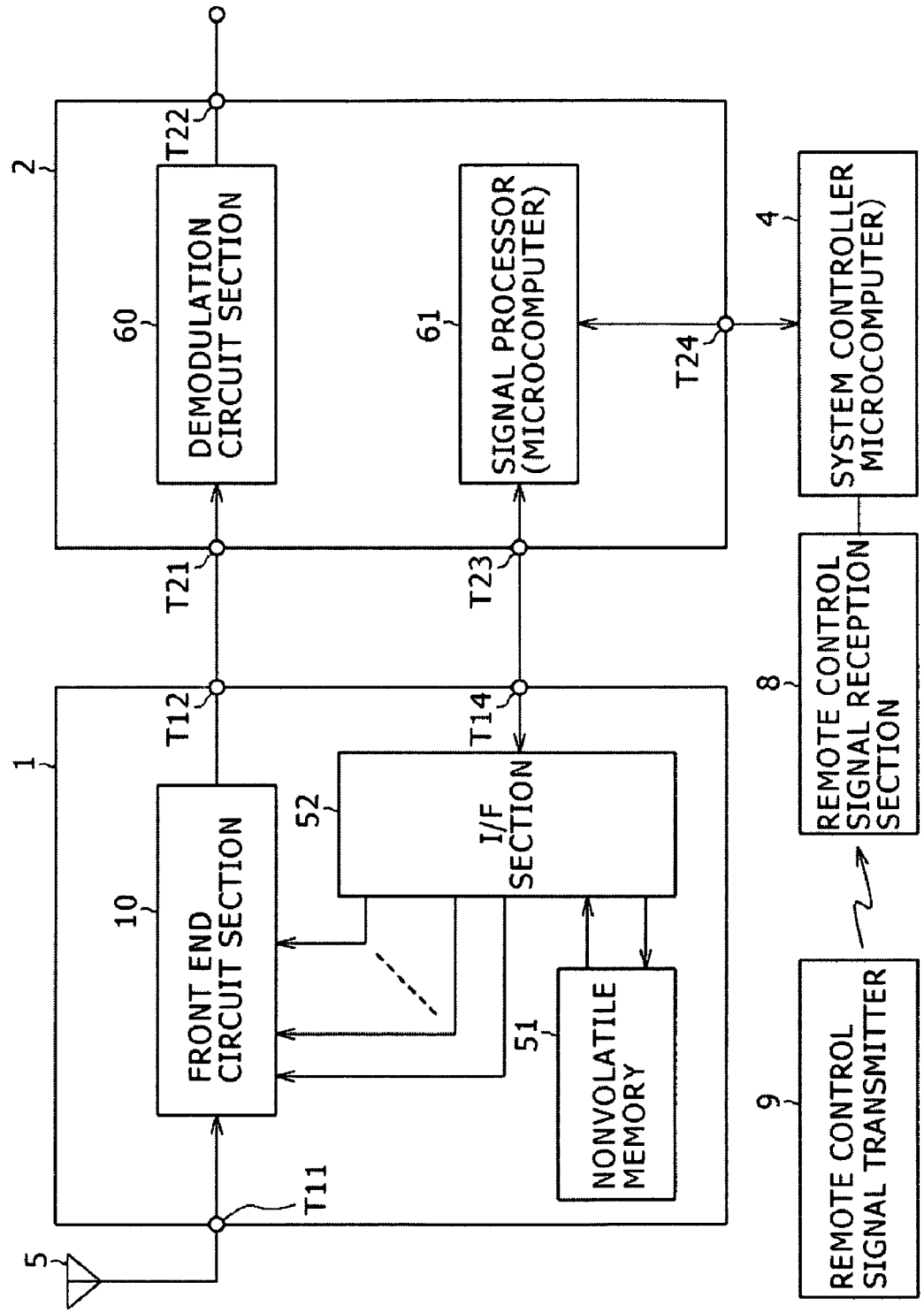
FIG. 7 is a block diagram showing an example of a processing circuit to which the voltage-controlled variable frequency oscillation circuit of FIG. 6 is applied.

FIG. 7 shows an example of a configuration of part of a television broadcast receiver to which the VCO of the fourth embodiment is applied. Referring to FIG. 7, the television broadcast receiver has a simplified configuration thanks to adoption of ICs and includes a front end circuit IC 1 and a demodulation circuit IC 2 as principal components thereof and further includes a system controller 4 formed including a microcomputer. Further, the demodulation circuit IC 2 includes a signal processor 61 formed from a microcomputer.

A remote control signal reception section 8 is connected to the system controller 4. The remote control signal reception section 8 receives a remote control signal from a remote control signal transmitter 9 and transfers the remote control signal to the system controller 4. The system controller 4 analyzes the received remote control signal, decides a user operation such as a power on/off operation or a channel selection operation, and carries out suitable control in response to a result of the decision.

A television broadcast signal received by a television broadcast signal reception antenna 5 is supplied to the front end circuit IC 1 through an antenna terminal pin T11.

In the present embodiment, the front end circuit IC 1 includes a front end circuit section 10 which is an example of an internal component which can be adjusted with adjustment data, a nonvolatile memory 51 for storing adjustment data acquired in advance, and an interface section 52.

The front end circuit section 10 includes a PLL circuit which includes the VCO according to the present embodiment and a plurality of adjustment requiring portions which require adjustment thereof against a dispersion. Adjustment data determined in advance regarding adjustment items of the adjustment requiring portions of the front end circuit section 10 before shipment of the television broadcast receiver from a fabrication factory are stored as beforehand acquired adjustment data in the nonvolatile memory 51.

The nonvolatile memory 51 is connected to the interface section 52. The interface section 52 is connected to a signal processor or microcomputer 61 hereinafter described of the demodulation circuit IC 2 through a terminal pin T14 of the front end circuit IC 1.

In this instance, in order to acquire beforehand acquired adjustment data, the tester is used to first adjust the adjustment data regarding the adjustment items of the adjustment requiring portions so that an optimum state may be obtained at a value determined in advance of a parameter which varies, in the present embodiment, of the frequency of a channel to be selected. Then, the adjustment data when the optimum state is obtained are stored as the beforehand acquired adjustment data in a corresponding relationship to the corresponding parameter value, that is, the corresponding frequency value, into the nonvolatile memory 51 through the signal processor 61.

It is to be noted that alternatively the tester may write the beforehand acquired adjustment data not through the signal processor 61 but through the interface section 52.

In the present embodiment, as regards the parameter values at which the beforehand acquired adjustment data are stored, the beforehand acquired adjustment data need not be acquired for the frequencies corresponding to all channels to be selected but may be discrete parameter values. As hereinafter described, adjustment data corresponding to a parameter value between the discrete parameter values can be acquired by an interpolation process from the beforehand acquired adjustment data stored in the nonvolatile memory as hereinafter described.

For example, where the dispersion of the above-described resistance of the VCO varies in response to the variation of the oscillation frequency of the VCO, there is no necessity to store a great number of data of all receiving channel frequencies and so forth, but adjustment data at discrete receiving channel frequencies are stored. Alternatively, where the dispersion of the resistance of the VCO does not depend upon the oscillation frequency of the VCO, there is no necessity to store a large number of data of all receiving channel frequencies and so forth, but a certain one adjustment data is stored.

It is to be noted that the formerly acquired data stored in the nonvolatile memory 51 are in an error correction encoded form.

Some of the beforehand acquired adjustment data stored in the nonvolatile memory 51 which do not exhibit any variation with regard to a parameter such as the frequency may be supplied as they are as actual adjustment data to the adjustment requiring portions of the front end circuit section 10 if they are subjected to an error correction decoding process.

However, as regards principal adjustment data where the channel frequency is a parameter, if it is tried to store the data for all parameter values, then a large number of data is to be stored as described hereinabove. Therefore, a comparatively small number of beforehand acquired adjustment data only for discrete parameter values are stored. Accordingly, in this instance, the beforehand acquired adjustment data are not actual adjustment data which are supplied as they are to the adjustment requiring portions of the front end circuit section 10, but are used as basic data when the signal processor or microcomputer 61 of the demodulation circuit IC 2 hereinafter described produces actual adjustment data by an interpolation process.

The beforehand acquired adjustment data stored in the nonvolatile memory 51 are read out in accordance with a reading out request received from the signal processor 61 of the demodulation circuit IC 2 through the interface section 52. The interface section 52 has a function of transferring the beforehand acquired adjustment data read out from the nonvolatile memory 51 in accordance with the reading out request to the signal processor 61.

As hereafter described, the signal processor 61 produces actual use adjustment data from the beforehand acquired adjustment data read out from the nonvolatile memory 51 and sends the actual use adjustment data to the front end circuit IC 1. The interface section 52 has a function of receiving the actual use adjustment data from the signal processor 61, storing the actual use adjustment data into the built-in register and supplying the actual use adjustment data to the adjustment requiring portions of the front end circuit section 10.

The front end circuit section 10 converts a received television broadcast signal into an intermediate frequency signal. Then, the front end circuit section 10 signals the intermediate frequency signal to the demodulation circuit IC 2 through a terminal pin T12.

In the present embodiment, the demodulation circuit IC 2 includes a demodulation circuit section 60 for producing an image output signal from the intermediate frequency signal and the signal processor or microcomputer 61 described hereinabove.

To the demodulation circuit section 60, the intermediate frequency signal from the front end circuit IC 1 is supplied through a terminal pin T21. The demodulation circuit section 60 demodulates the inputted intermediate frequency signal to produce an image output signal and supplies the image output signal to an image output amplifier through a terminal pin T22.

The signal processor 61 is connected to the interface section 52 of the front end circuit IC 1 through a terminal pin T23 and connected also to the system controller 4 through a terminal pin T24.

The signal processor 61 has a function of carrying out writing/reading out accessing to the nonvolatile memory 51 and a function of error correcting and decoding the beforehand acquired adjustment data acquired from the nonvolatile memory 51 to produce actual use adjustment data. The function of producing actual use adjustment data includes a function of producing actual use adjustment data from beforehand acquired adjustment data by interpolation.

Particular Example of the Front End Circuit IC 1

Figure 8:
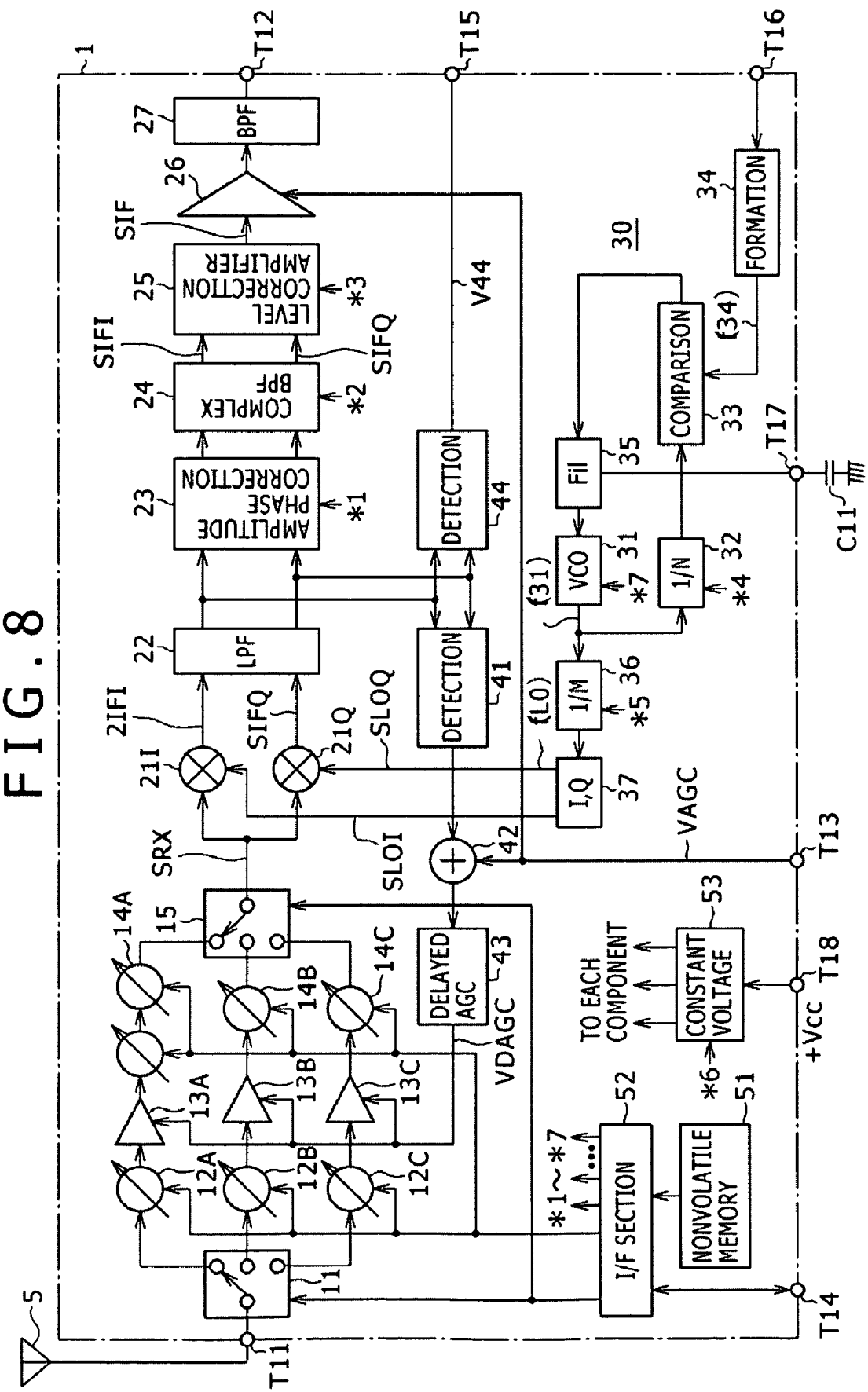
FIG. 8 is a block diagram showing an example of a particular configuration of the processing circuit shown in FIG. 7.

FIG. 8 shows a particular example of the front end circuit IC 1 in the present embodiment, particularly of the front end circuit section 10.

Various frequencies or channels are used for television broadcasting in different countries, and the NTSC (National Television System Committee) system, the PAL (Phase Alternating Line) system, the SECAM (Séquentiel couleur à mémoire) system and so forth are available as the color television system. Further, also analog broadcasts and digital broadcasts are available.

Therefore, it seems a promising countermeasure to divide the reception signal system for a television broadcast into a front end circuit for receiving a television broadcast and outputting an intermediate frequency signal and a base band processing circuit for processing the output of the front end circuit and outputting a color image signal and a sound signal. The countermeasure deals with the difference in the broadcasting system of a television broadcast.

FIG. 8 shows an example of a front end circuit configured to receive television broadcasts in various countries irrespective of the difference in the broadcasting form. The front end circuit of FIG. 8 divides the frequencies used in television broadcasts in different countries into three bands including (A) 46 to 147 MHz (VHV-L band), (B) 147 to 401 MHz (VHF-H band), and (C) 401 to 887 MHz (UHF band)

such that the frequency to be used can be changed in accordance with an object channel in each of the reception bands.

Referring to FIG. 8, a block 1 surrounded by a chain line denotes the front end circuit which is formed as an one-chip IC as described hereinabove.

Broadcasting wave signals of television broadcasts are received by an antenna, and reception signals of the received broadcasting wave signals are selectively supplied to antenna tuning circuits 12A to 12C through a switch circuit 11 past the terminal pin T11. In this instance, the antenna tuning circuits 12A to 12C correspond to the reception bands of (A) to (C) given hereinabove, respectively. Each of the antenna tuning circuits 12A to 12C changes with digital data the capacitance of a tuning capacitor to change the tuning frequency so as to be tuned to the reception signal of an object frequency or channel.

The reception signals from the antenna tuning circuits 12A to 12C are supplied to a switch circuit 15 through high frequency amplification circuits 13A to 13C and then through interstage tuning circuits 14A to 14C, respectively. The switch circuit 15 is switched in an interlocking relationship with the switch circuit 11, and accordingly, a reception signal SRX of an object reception band is extracted from the switch circuit 15. Then, the extracted reception signal SRX is supplied to mixer circuits 21I and 21Q.

It is to be noted that, although also the interstage tuning circuits 14A to 14C are formed similarly to the antenna tuning circuits 12A to 12C, the interstage tuning circuit 14A is formed as a demodulation tuning circuit. Further, as hereinafter described, the tuning capacitors of the tuning circuits 12A to 12C and 14A to 14C are built in the IC 1, but the tuning coils are provided externally of the IC 1.

A VCO 31 has a configuration to which the VCO of the third embodiment is applied. The VCO 31 forms an oscillation signal of a predetermined frequency. The VCO 31 is used to form a local oscillation signal and forms part of a PLL circuit 30. In particular, the oscillation signal of the VCO 31 is supplied to a variable dividing circuit 32, by which it is divided into a signal of a 1/N (N is a positive integer) frequency. The divided signal is supplied to a phase comparison circuit 33. Further, a clock having a frequency of about 1 to 2 MHz is supplied to a signal formation circuit 34 through a terminal pin T16 to be divided into a signal of a predetermined frequency f34. The divided signal is supplied as a reference signal to a phase comparison circuit 33.

Then, a comparison output of the phase comparison circuit 33 is supplied to a loop filter 35, from which a dc voltage, that is, a controlling voltage VC, whose level varies in response to the phase difference between the output signal of the variable dividing circuit 32 and an output signal of the signal formation circuit 34. The dc voltage, that is, the controlling voltage VC, is supplied as a control voltage for the oscillation frequency f31 to the VCO 31. It is to be noted that a smoothing capacitor C11 is externally connected to the loop filter 35 through a terminal pin T17.

Accordingly, the oscillation frequency f31 of the VCO 31 is given by $$f31 = N \cdot f34 \quad \text{(expression 2)}$$

Therefore, the oscillation frequency f31 of the VCO 31 can be changed by the system controller 4 by controlling the dividing ratio N through the signal processor 61. For example, the oscillation frequency f31 is 1.8 to 3.6 GHz in response to the reception band and the reception frequency or reception channel.

Then, the oscillation signal of the VCO 31 is supplied to a variable dividing circuit 36, by which it is divided into a frequency of 1/M (for example, M=2, 4, 8, 16 or 32). Also the dividing ratio M of the variable dividing circuit 36 is controlled through the signal processor 61 by the system controller 4.

Then, the divided signal from the variable dividing circuit 36 is supplied to a dividing circuit 37, by which it is divided into dividing signals SL0I and SL0Q which have a ½ frequency and have phases orthogonal to each other. The dividing signals SL0I and SL0Q are supplied as local oscillation signals to the mixer circuits 21I and 21Q, respectively.

Here, if fL0: frequency of the dividing signals SL0I and SL0Q then $$fL0 = f31/(2M)$$
$$= N \cdot f34/(2M)$$
$$= f34 \cdot N/(2M)$$

Accordingly, by changing the dividing ratios M and N, the local oscillation frequency fL0 can be varied with a predetermined frequency step over a wide range.

Further,

SRX: reception signal to be received

SUD: image disturbance signal and, for the simplification, $$SRX = ERX \cdot \sin \omega RXt$$

ERX: amplitude of the reception signal SRX

ωRX=2πfRX fRX: center frequency of the reception signal SRX $$SUX = EUD \cdot \sin \omega UDt$$

EUD: amplitude of the image disturbance signal SUD
$\omega UD = 2\pi fUD$
fUD: center frequency of the image disturbance signal SUD Further, the local oscillation signals SL0I and SL0Q are set as $$SL0I = EL0 \cdot \sin \omega L0t$$

$$SL0Q = EL0 \cdot \cos \omega L0t$$

EL0: amplitude of the signals SL0I and SL0Q
$\omega L0 = 2\pi fL0$
However, in this instance, if $$\omega IF = 2\pi fIF$$

fIF: intermediate frequency. For example, 4 to 5.5 MHz (varied depending upon the broadcasting system)
then, in the case of the upper heterodyne system, $$fRX = fL0 - fIF$$

$$fUD = fL0 + fIF$$

Accordingly, the mixer circuits 21I and 21Q output the following signals SIFI and SIFQ, respectively. In particular, the signals SIFI and SIFQ of $$\begin{aligned} SIFI &= (SRX + SUD) \times SL0I \\ &= ERX \cdot \sin\omega RXt \times EL0 \cdot \sin\omega L0t + \\ &\quad EUD \cdot \sin\omega UDt \times EL0 \cdot \sin\omega L0t \\ &= \alpha\{\cos(\omega RX - \omega L0)t - \cos(\omega RX + \omega L0)t\} + \\ &\quad \beta\{\cos(\omega UD - \omega L0)t - \cos(\omega UD + \omega L0)t\} \end{aligned}$$

$$\begin{aligned} SIFQ &= (SRX + SUD) \times SL0Q \\ &= ERX \cdot \sin\omega RXt \times EL0 \cdot \cos\omega L0t + \\ &\quad EUD \cdot \sin\omega UDt \times EL0 \cdot \cos\omega L0t \\ &= \alpha\{\sin(\omega RX + \omega L0)t + \sin(\omega RX - \omega L0)t\} + \\ &\quad \beta\{\sin(\omega UD + \omega L0)t + \sin(\omega UD - \omega L0)t\} \end{aligned}$$

$$\alpha = ERX \cdot EL0 / 2$$
$$\beta = EUD \cdot EL0 / 2$$

are extracted.

Then, the signals SIFI and SIFQ are supplied to a low-pass filter 22 having a greater bandwidth than the occupation bandwidth, which is, for example, 6 to 8 MHz, of an image intermediate frequency signal and a sound intermediate frequency signal. As a result, the low-pass filter 22 removes signal components of the sum angular frequencies ($\omega RX + \omega L0$) and ($\omega UD + \omega L0$) (and the local oscillation signals SL0I and SL0Q). Consequently, $$\begin{aligned} SIFI &= \alpha \cdot \cos(\omega RX - \omega L0)t + \beta \cdot \cos(\omega UD - \omega L0)t \quad \text{(expression 4)} \\ &= \alpha \cdot \cos\omega IFt + \beta \cdot \cos\omega IFt \end{aligned}$$

$$\begin{aligned} SIFQ &= \alpha \cdot \sin(\omega RX - \omega L0)t + \beta \cdot \sin(\omega UD - \omega L0)t \quad \text{(expression 5)} \\ &= -\alpha \cdot \sin\omega IFt + \beta \cdot \sin\omega IFt \end{aligned}$$

are extracted from the low-pass filter 22.

Then, the signals SIFI and SIFQ are supplied to a complex band-pass filter 24, which is a polyphase band-pass filter, through a amplitude phase correction circuit 23 hereinafter described. The complex band-pass filter 24 has the following characteristics (a) to (d):

(a) It has a frequency characteristic of a band-pass filter.
(b) It has a phase shift characteristic and shifts the phase of the signal SIFI by a value $\phi$ which is an arbitrary value.
(c) It shifts the phase of the signal SIFQ by a value ($\phi - 90°$) similarly.
(d) It has two band-pass characteristics which have a frequency f0 and another frequency -f0, which are symmetrical with respect to the zero frequency on a frequency axis, as the center frequencies thereof, and one of the two band-pass characteristics can be selected by a relative phase between the input signals.

Accordingly, the complex band-pass filter 24 delays the signal SIFQ by 90° with respect to the signal SIFI from the items (b) and (c) above as given by $$SIFI = \alpha \cdot \cos\omega IFt + \beta \cdot \cos\omega IFt \quad \text{(expression 6)}$$

$$\begin{aligned} SIFQ &= -\alpha \cdot \sin(\omega IFt - 90°) + \beta \cdot \sin(\omega IFt - 90°) \quad \text{(expression 7)} \\ &= \alpha \cdot \cos\omega IFt - \beta \cdot \cos\omega IFt \end{aligned}$$

In short, in the signal SIFI and the signal SIFQ, the signal components $\alpha \cdot \cos \omega IFt$ have the same phase with each other whereas the signal components $\beta \cdot \cos \omega IFt$ have phases opposite to each other.

Then, the signals SIFI and SIFQ are supplied to an level correction amplifier 25 for level correction, by which they are added to each other. Consequently, such a signal SIF as described below is extracted from the level correction amplifier 25.

In particular, $$\begin{aligned} SIF &= SIFI + SIFQ \quad \text{(expression 8)} \\ &= 2\alpha \cdot \cos\omega IFt \\ &= ERX \cdot EL0 \cdot \cos\omega IFt \end{aligned}$$

is extracted. The extracted signal SIF is nothing but an intermediate frequency signal when the reception signal SRX is received in accordance with the upper heterodyne system. This intermediate frequency signal SIF does not include the image disturbance signal SUD. It is to be noted that the amplitude phase correction circuit 23 corrects the amplitude and the phase of the signals SIFI and SIFQ so that the (expression 8) may be satisfied sufficiently, that is, the image disturbance signal SUD may be minimized.

Further, at this time, the level correction amplifier 25 for level correction corrects the level of the signal SIF so that, even if the level of the signals SIFI and SIFQ differs depending upon the broadcasting system, an AGC characteristic hereinafter described, particularly the start level of AGC, or the like may not vary.

Then, the intermediate frequency signal SIF is outputted to the terminal pin T12 through a variable gain amplifier 26 for AGC and a band-pass filter 27 for dc component cutting and aliasing.

Accordingly, if the dividing ratios M and N are varied, then an object frequency or channel can be selected in accordance with the (expression 3), and if the intermediate frequency signal SIF outputted to the terminal pin T12 is demodulated in accordance with the broadcasting system, then the object broadcast can be enjoyed.

In this manner, with the present front end circuit section 10, the broad frequency range from 46 to 887 MHz can be coped with by a one-chip IC. Further, the front end circuit section 10 can be implemented using a reduced number of parts without deteriorating the characteristic against disturbance over the wide frequency range. Further, the front end circuit section 10 can cope with a difference in the broadcasting system between the analog broadcasting and the digital broadcasting or with a difference in the broadcasting system among different districts in the world.

Further, reception disturbance by harmonics of a clock signal is reduced, and as a result, the reception sensitivity is improved. Furthermore, since all circuit components of the PLL circuit 30 except the capacitor C11 can be formed on a chip, the PLL circuit 30 is tough against disturbance and suffers less likely from disturbance. Further, since only the interstage tuning circuits 14A to 14C are connected to the high frequency amplification circuits 13A to 13C, respectively, the load is light and signal distortion by the high frequency amplification circuits 13A to 13C is low.

An AGC voltage VAGC is formed by an AGC voltage generation circuit 63 of the demodulation circuit IC 2 at the next stage to the front end circuit IC 1 and is supplied as a gain controlling signal to the variable gain amplifier 26 for AGC through a terminal pin T13. Accordingly, ordinary AGC, that is, AGC of the intermediate frequency signal, is carried out with the gain controlling signal.

Further, for example, if the level of the object reception signal SRX is excessively high or a disturbance wave signal of a high level is included in the reception signal SRX, then the ordinary AGC cannot cope with this. Therefore, the signals SIFI and SIFQ outputted from the low-pass filter 22 are supplied to a level detection circuit 41, by which it is detected whether or not the level of the signals SIFI and SIFQ before AGC is carried out by the amplifier 26 for AGC exceeds a predetermined value. Then, a detection signal of the level detection circuit 41 and the AGC voltage VAGC of the terminal pin T15 are supplied to an addition circuit 42, and an addition output from the addition circuit 42 is supplied to a delayed AGC voltage formation circuit 43, by which a delayed AGC voltage VDAGC is formed. The delayed AGC voltage VDAGC is supplied as a gain controlling signal to the high frequency amplification circuits 13A to 13C to carry out delay AGC.

Accordingly, since optimum AGC operation can be achieved from D/U of the intensity of a signal to be received and the intensity of many signals not to be received, a desired broadcast from among digital broadcasts, analog broadcasts or digital and analog broadcast can be received favorably.

The signals SIFI and SIFQ outputted from the low-pass filter 22 are supplied to a linear detection circuit 44, by which they are detected and smoothed to form a dc voltage V44 which represents the level of the signals SIFI and SIFQ. The dc voltage V44 is outputted to a terminal pin T15.

The dc voltage V44 outputted to the terminal pin T15 is used upon testing or adjustment of the front end circuit IC 1. For example, the dc voltage V44 can be used in order to check the level of the input signal, that is, the reception signal, over a wide frequency range. In particular, different from an output from an intermediate frequency filter of a narrow band, the attenuation characteristic over a wide band along the signal lines from the antenna terminal pin T11 to the mixer circuits 21I and 21Q can be checked directly.

Further, where the antenna tuning circuits 12A to 12C and the interstage tuning circuits 14A to 14C are to be adjusted, if a test signal is applied to the antenna terminal pin T11 and the AGC voltage VAGC to be supplied to the terminal pin T13 is fixed to a predetermined value, then tracking adjustment can be carried out from the variation of the dc voltage V44. Further, adjustment of various functions and measurement of a characteristic of the front end circuit IC 1 can be carried out with digital data, and automatic adjustment and automatic measurement can be carried out.

Constant Voltage Circuit

The front end circuit IC 1 in the present embodiment includes a constant voltage circuit 53, to which a power supply voltage +VCC is supplied through a terminal pin T18. The constant voltage circuit 53 makes use of a band gap of the PN junction to form a constant voltage of a predetermined value from the power supply voltage +VCC, and the constant voltage formed in this manner is supplied to the component circuits of the IC 1. It is to be noted that an output voltage of the constant voltage circuit 53 can be adjusted finely, and adjustment data therefor is stored in the nonvolatile memory 51. The signal processor 61 acquires the adjustment data for fine adjustment from the nonvolatile memory 51 to produce actual use adjustment data and supplies the actual use adjustment data to the constant voltage circuit 53 through the interface section 52.

Accordingly, the output power supply voltage of the constant voltage circuit 53 is a constant voltage finely adjusted for each front end circuit IC 1. Therefore, even where the component circuits are formed from MOSFETs, the power supply voltage to be supplied to the circuits can be set to a rather high value. Consequently, the performance of the MOSFETs can be extracted in the maximum.

With the configuration of the front end circuit IC 1 shown in FIG. 8, television broadcasts in the frequency band of 46 to 887 MHz as indicated in the items (A) to (C) given hereinabove. At this time, since the center frequency and the passband width of the complex band-pass filter 24 are variable, not only ground wave digital television broadcasts and ground wave analog television broadcasts in Japan but also those outside Japan can be coped with.

Figure 9:
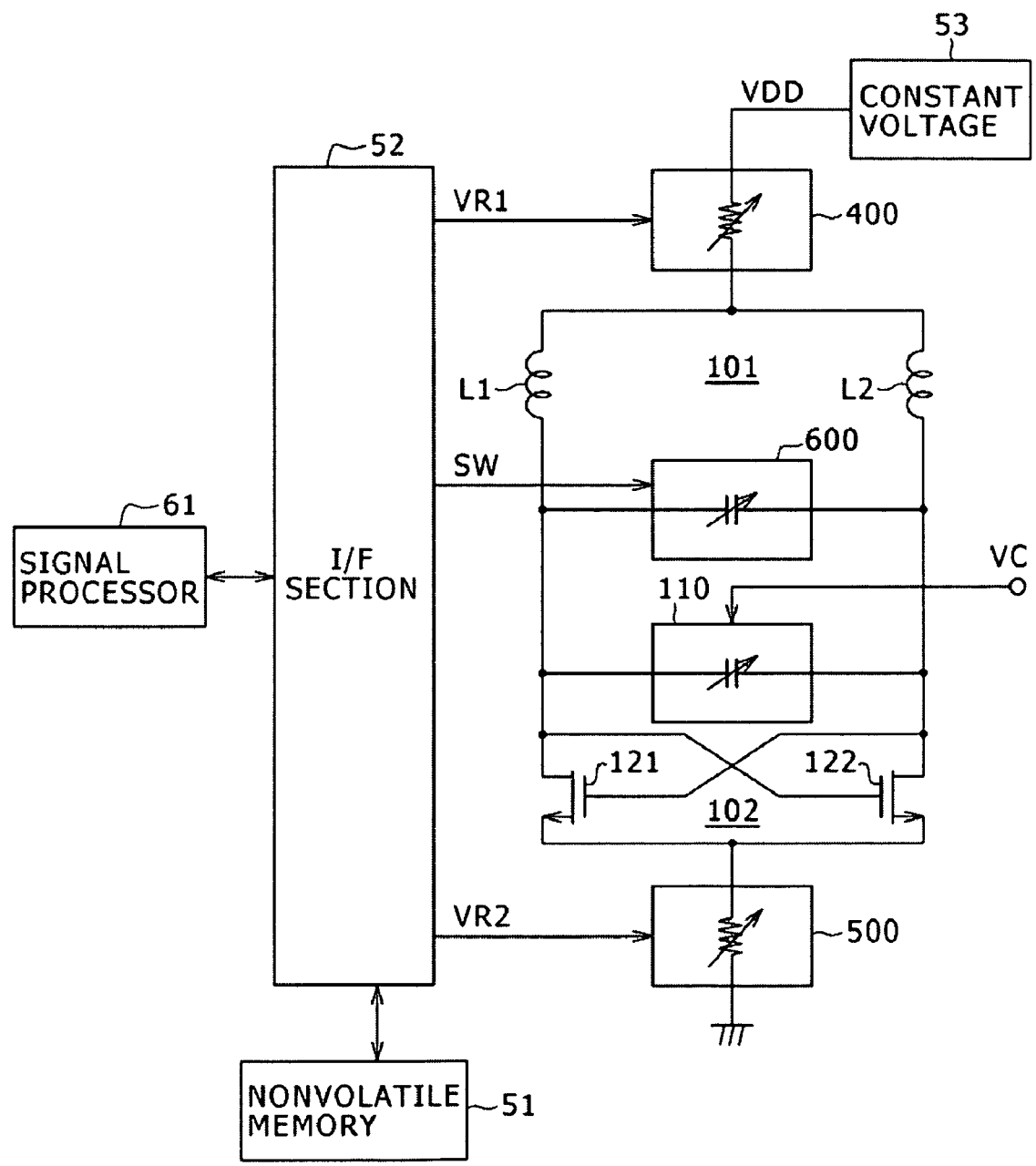
FIG. 9 is a block diagram showing a particular configuration of part of the voltage-controlled variable frequency oscillation circuit shown in FIG. 8.

FIG. 9 shows a more detailed configuration of the control section of the VCO 31 in the fourth embodiment.

In the present embodiment, for example, if a power supply is made available to the broadcast receiver, then the signal processor 61 sends an acquisition request for beforehand acquired adjustment data to the nonvolatile memory 51 through the interface section 52 to read out the beforehand acquired adjustment data from the nonvolatile memory 51. Then, the signal processor 61 receives the beforehand acquired adjustment data read out from the nonvolatile memory 51 through the interface section 52 and stores the received beforehand acquired adjustment data into a cache memory built therein. At this time, the signal processor 61 carries out an error correction decoding process for the read out adjustment data.

During operation wherein the power supply is on, the signal processor 61 uses the beforehand acquired adjustment data stored in the cache memory to produce actual use adjustment data. Thereupon the signal processor 61 carries out also a process of producing actual use adjustment data through an interpolation process based on the beforehand acquired adjustment data stored in the cache memory.

Then, the signal processor 61 supplies the produced actual use adjustment data to the VCO 31 and the individual adjustment object portions of the front end circuit section 10 through the interface section 52.

As seen in FIG. 9, the interface section 52 supplies, from among the received actual use adjustment data, adjustment data VR1 and VR2 for the VCO 31 to the variable resistance circuit 400 and the variable resistance circuit 500, respectively, so that the resistance is adjusted against a dispersion and the bias current value to the variable capacitance circuit 110 is controlled to prevent deterioration of the oscillation amplitude of the oscillation output signal from the VCO 31.

Further, the interface section 52 supplies the switching controlling signal SW received from the signal processor 61 to the capacitance changeover circuit 600 to change over the oscillation center frequency.

With the present fourth embodiment, the resistance value of the variable resistance circuit 400 and the variable resistance circuit 500 can be finely adjusted using dispersion adjustment data determined in advance.

It is to be noted that, as seen in FIG. 9, in the present fourth embodiment, the power supply potential VDD of the VCO 31 is a potential formed as a constant voltage by the constant voltage circuit 53 in the front end circuit IC 1.

Although the spurious characteristic or the phase noise characteristic of a VCO is sometimes influenced much by external noise or thermal noise mixed into a power supply voltage, in the present embodiment, since the power supply potential VDD is formed as a constant voltage by the constant voltage circuit 53, the problem described is moderated. In this instance, the constant voltage circuit 53 preferably has a low output noise characteristic and a high power supply rejection ratio (PSRR) characteristic so that the influence of external noise and so forth can be reduced.

It is to be noted that, as described hereinabove, the configuration of the variable resistance circuits 400 and 500 is not limited to that described hereinabove with reference to FIG. 6 which is composed of a switch circuit and a resistance element, but a MOSFET may be used as a variable resistance element, or both of a variable resistance circuit which uses a MOSFET as a variable resistance element and another variable resistance circuit which uses a switch circuit and a resistance element as a variable resistance element may be used. Where a MOSFET is used as a variable resistance element, fine adjustment of the resistance value is easy.

Fifth Embodiment

Figure 10:
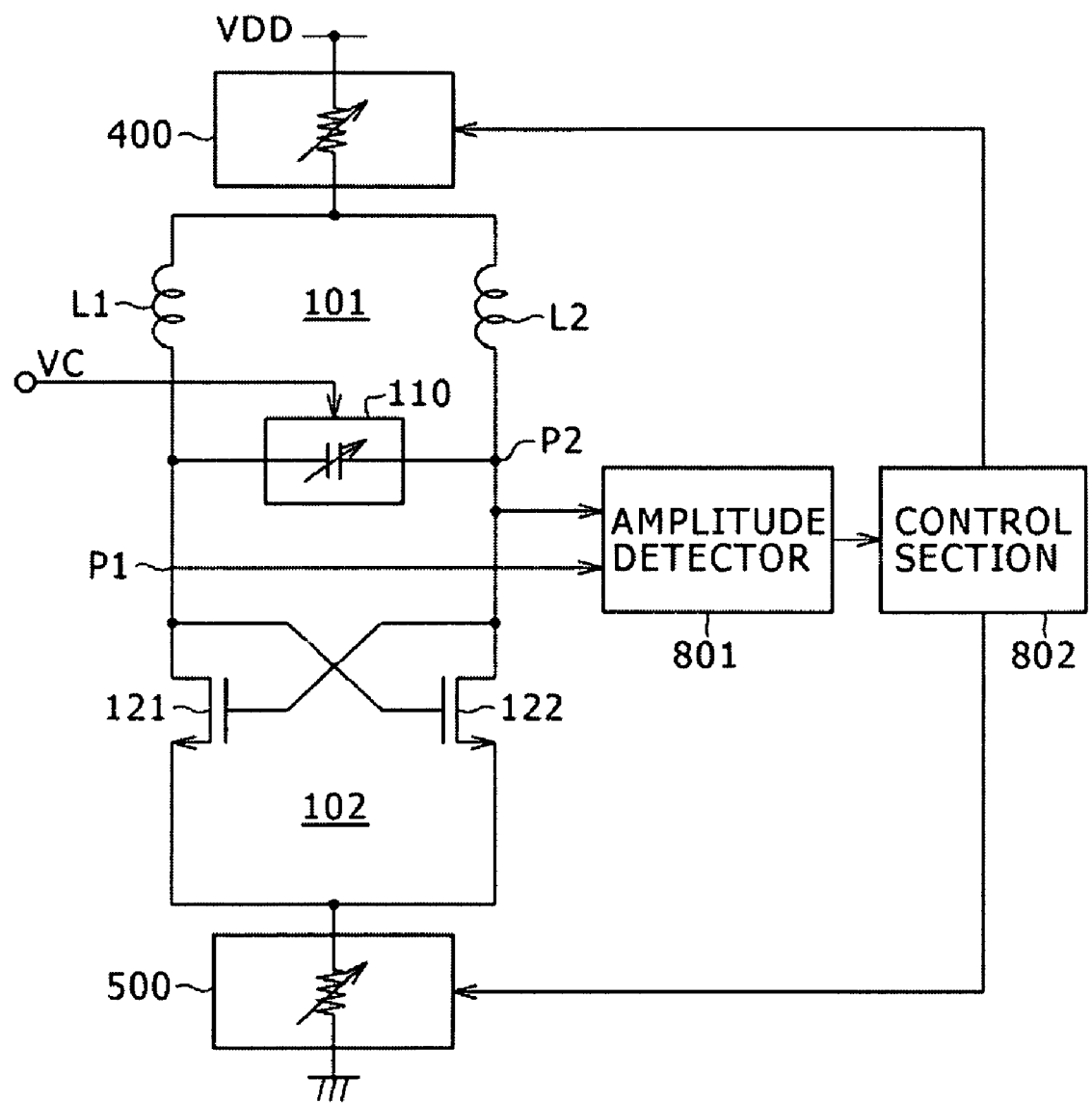
FIGS. 10 to 13 are circuit diagrams showing voltage-controlled variable frequency oscillation circuits according to fifth to eighth embodiments, respectively.

An example of a configuration of a VCO according to a fifth embodiment is shown in FIG. 10. Referring to FIG. 10, in the VCO of the present fifth embodiment, an oscillation amplitude of the VCO obtained between the connecting point P1 and the connecting point P2, that is, between the drain of the MOSFET 121 and the drain of the MOSFET 122, is detected by an amplitude detector 801. Then, the value of the oscillation amplitude of the VCO detected by the amplitude detector 801 is supplied to a control section 802.

The control section 802 controls the variable resistance circuits 400 and 500 so that the detection oscillation amplitude may be fixed.

Consequently, with the present fifth embodiment, characteristic deterioration of the VCO arising from a dispersion in the oscillation frequency or a resistance element can be compensated for.

Sixth Embodiment

Figure 11:
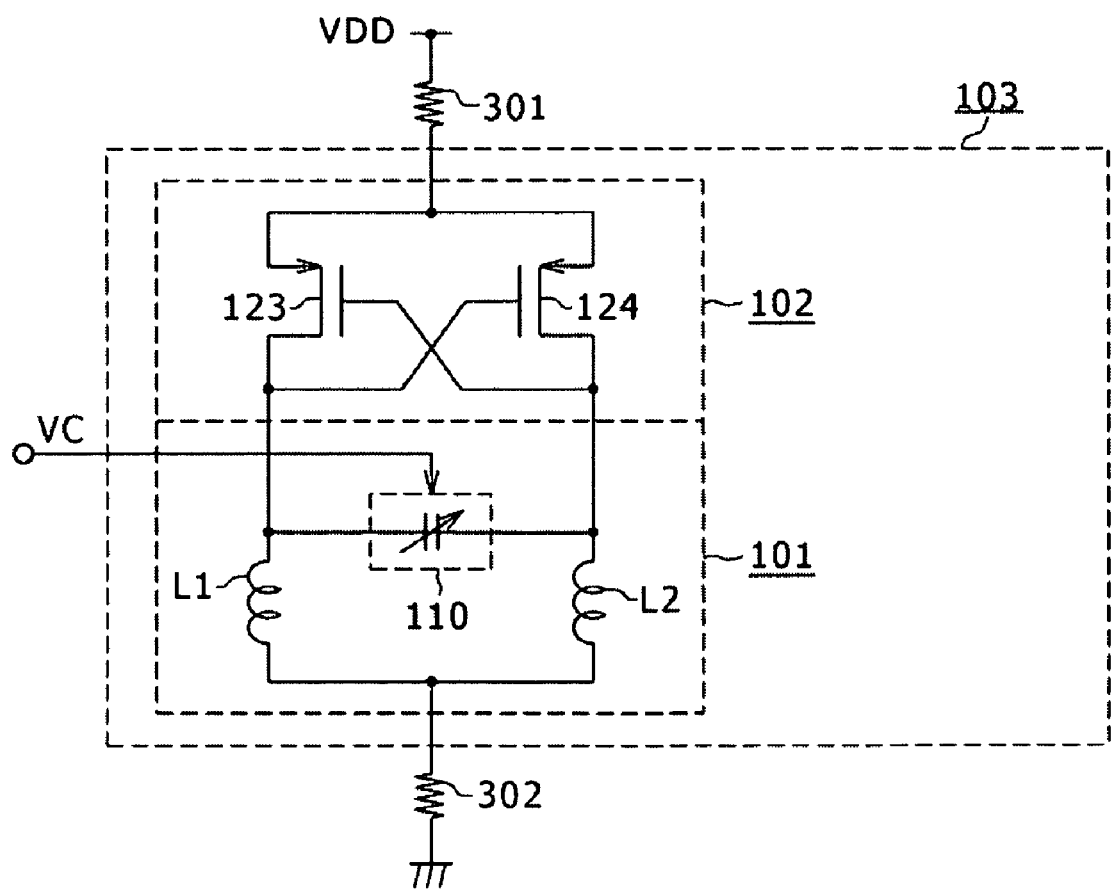

An example of a configuration of a VCO according to a sixth embodiment is shown in FIG. 11. In the first embodiment, the negative resistance circuit 102 is formed from the MOSFETs 121 and 122 as seen in FIG. 1. In contrast, in the present sixth embodiment, the negative resistance circuit 102 is composed of a pair of P-type MOSFETs 123 and 124.

In the present sixth embodiment, a connecting point of the sources of the P-type MOSFETs 123 and 124 which have a differential configuration therebetween is connected to the power supply line 104 through the first resistor 301 similarly to that of the MOSFETs 121 and 122. A connecting point of the coils L1 and L2 of the resonance circuit 101 is grounded through the second resistor 302.

Seventh Embodiment

Figure 12:
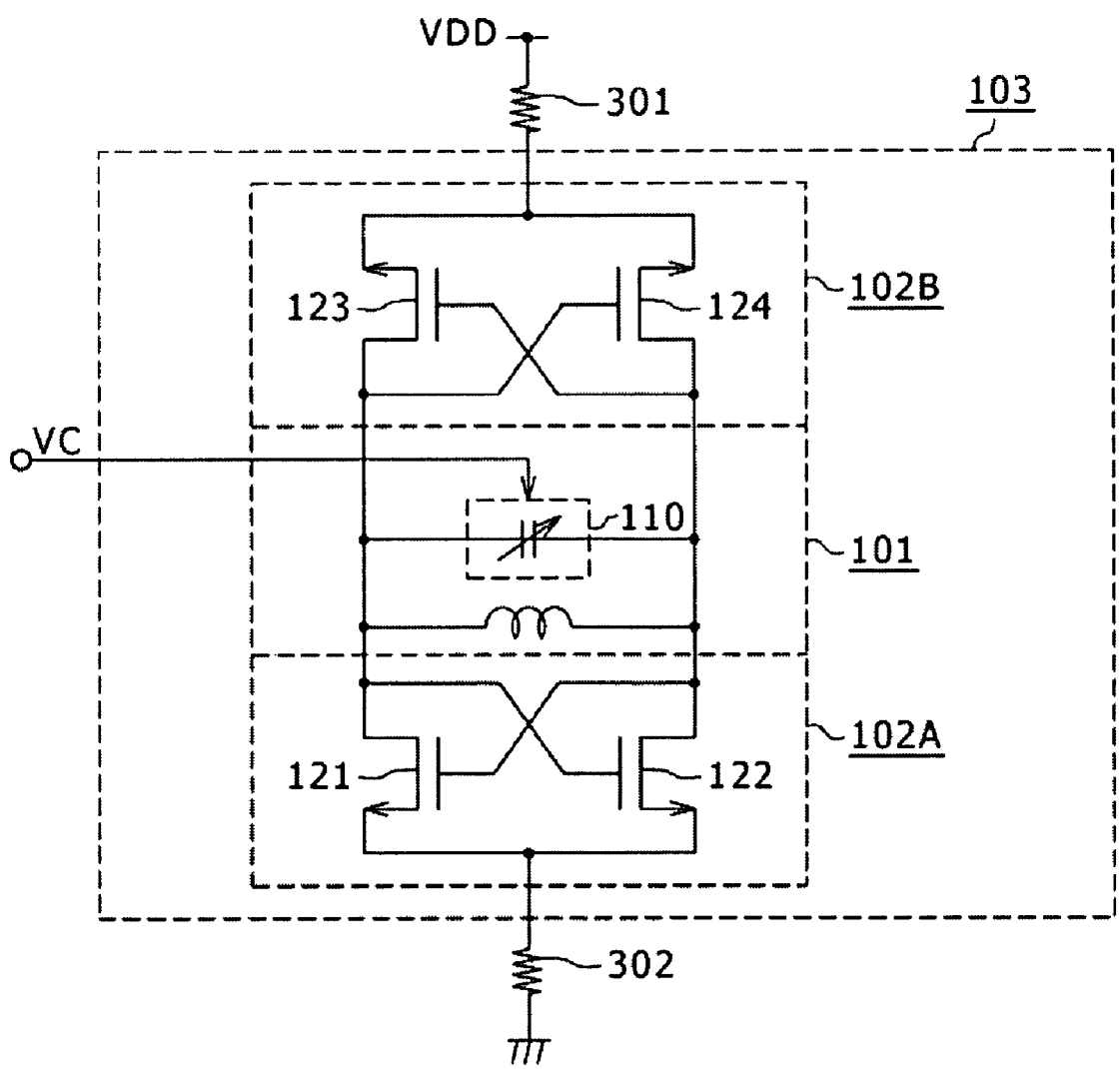

An example of a configuration of a VCO of a seventh embodiment is shown in FIG. 12.

In the present seventh embodiment, the negative resistance circuit is formed in a CMOS configuration including a negative resistance circuit 102A formed from a pair of N-type MOSFETs 121 and 122 and another negative resistance circuit 102B formed from a pair of P-type MOSFETs 123 and 124.

Referring to FIG. 12, in the present seventh embodiment, a connecting point of the sources of the P-type MOSFETs 123 and 124 of the negative resistance circuit 102B is connected to the power supply line 104 through the resistor 301. Meanwhile, a connecting point of the sources of the MOSFETs 121 and 122 of the negative resistance circuit 102A is grounded through the resistor 302.

The resonance circuit 101 including the variable capacitance circuit 110 is provided between the negative resistance circuit 102A and the negative resistance circuit 102B.

Eighth Embodiment

In the first to seventh embodiments described above, the first resistor 301 is connected between the oscillation circuit section 103 and one of the terminals of the power supply and the second resistor 302 is connected also between the oscillation circuit section 103 and the other terminal of the power supply.

However, from the object of increasing the variable capacitance region from an existing one by adjusting the bias voltage to a variable capacitance element which composes a variable capacitance circuit, a current supply source may be connected in place of the second resistor 302.

Figure 13:
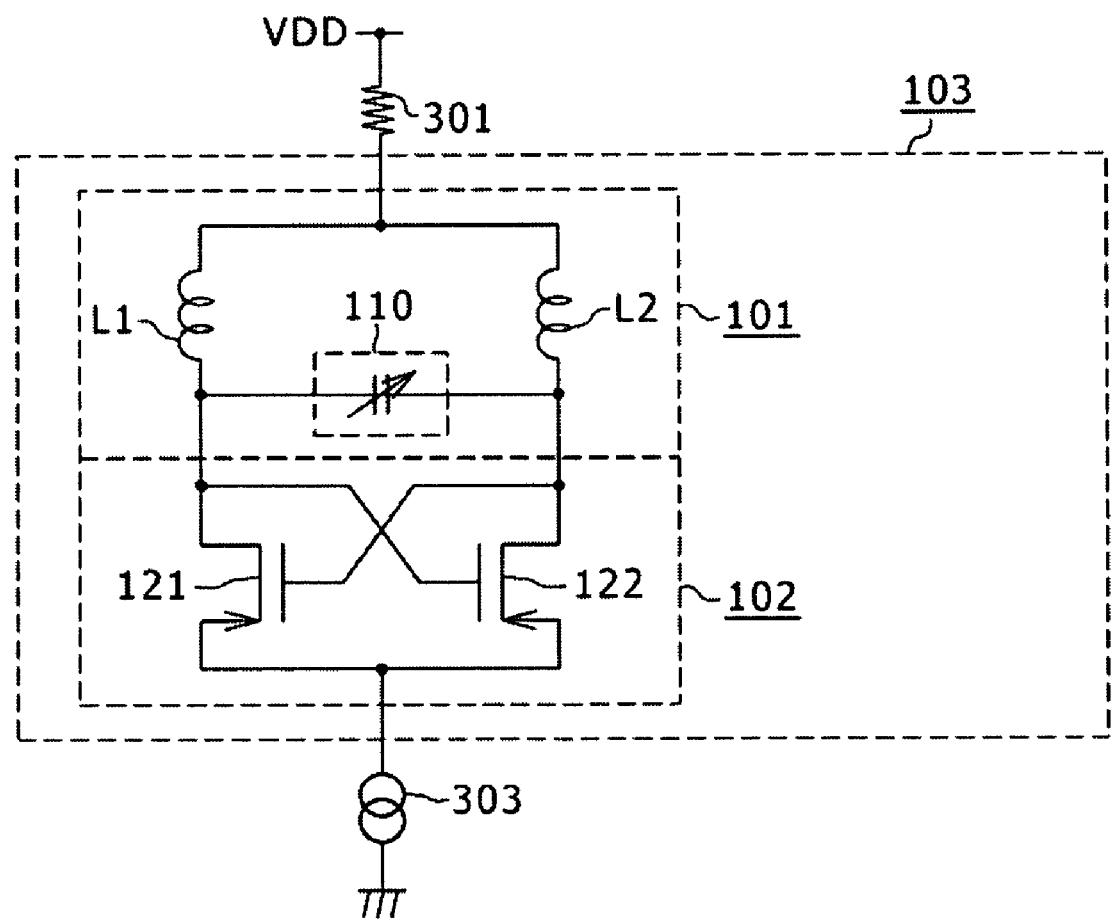

FIG. 13 shows an example of the eighth embodiment which has the configuration just described. In particular, the VCO is a modification to but is different from the VCO of the first embodiment in that a current source 303 is provided in place of the second resistor 302.

Other Embodiments and Modifications

While, in the embodiments described above, a varactor is used as a variable capacitance element of the current controlled type, the variable capacitance element to which the present application is applied is not limited to the varactor.

Further, while, in the foregoing description, only a case is described wherein the voltage-controlled variable frequency oscillation circuit according to the present application is used only as a VCO of a PLL circuit of a front end circuit of a television broadcast receiver, the application of the VCO of the present application is not limited to this, but the VCO can be applied to various signal processing circuits.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention is claimed as follows:

1. A voltage-controlled variable frequency oscillation circuit, comprising:
   an oscillation circuit section including a resonance circuit which includes a coil and a variable capacitance element, and a negative resistance circuit; and
   a first resistor connected between the resonance circuit of said oscillation circuit section and a first one of a pair of terminals of a power supply, wherein said first resistor includes a plurality of resistance elements and a plurality of switch circuits, said switch circuits being individually controlled with a controlling signal between on and off to variably control the resistance value of said first resistor;
   a second resistor connected between the negative resistance circuit of said oscillation circuit section and a second one of the terminals of the power supply,
   wherein both of said first resistor and said second resistor have a variably controllable resistance value, and
   wherein both of said first resistor and said second resistor are formed from a plurality of resistance elements and a plurality of switch circuits, and said switch circuits are individually controlled between on and off to variably control the resistance value of said first and second resistors.

2. The voltage-controlled variable frequency oscillation circuit according to claim 1, wherein
   said resonance circuit includes a variable capacitance circuit whose capacitance is variably controlled in accordance with an oscillation frequency, and
   the resistance value of said first resistance is varied in response to the variation control of the capacitance in accordance with the oscillation frequency.

3. The voltage-controlled variable frequency oscillation circuit according to claim 1, further comprising
   a detection circuit for detecting the amplitude of an oscillation output signal of said oscillation circuit section and variably controlling the resistance value of said first resistor.

4. The voltage-controlled variable frequency oscillation circuit according to claim 1, wherein both of said first resistor and said second resistor are formed from a variable resistance element whose resistance value is variably controlled with a controlling signal.

5. The voltage-controlled variable frequency oscillation circuit according to claim 1, wherein the power supply provides a fixed voltage formed by a constant voltage circuit.

6. The voltage-controlled variable frequency oscillation circuit according to claim 2, wherein the resonance circuit further includes a capacitance changeover circuit for shifting an oscillation center frequency.

7. The voltage-controlled variable frequency oscillation circuit according to claim 6, wherein the resonance circuit further includes a plurality of coils, and
   wherein the capacitance changeover circuit is connected in parallel to the variable capacitance circuit between the variable capacitance circuit and the plurality of coils.

8. The voltage-controlled variable frequency oscillation circuit according to claim 7, wherein the capacitance changeover circuit includes at least one switch circuit connected between two capacitors.

9. A voltage-controlled variable frequency oscillation circuit, comprising:
   an oscillation circuit section including a resonance circuit which includes a coil and a variable capacitance element, and a negative resistance circuit,
   a first resistor connected between the resonance circuit of said oscillation circuit section and a first one of a pair of terminals of a power supply, wherein said first resistor includes a plurality of resistance elements and a plurality of switch circuits, said switch circuits being individually controlled with a controlling signal between on and off to variably control the resistance value of said first resistor,
   a second resistor connected between the negative resistance circuit of said oscillation circuit section and a second one of the terminals of the power supply,
   wherein both of said first resistor and said second resistor have a variably controllable resistance value,
   wherein said resonance circuit includes a variable capacitance circuit whose capacitance is variably controlled in accordance with an oscillation frequency, and
   the resistance value of both of said first and second resistors is varied in response to variation control of the capacitance in accordance with the oscillation frequency.

10. A voltage-controlled variable frequency oscillation circuit, comprising:
    an oscillation circuit section including a resonance circuit which includes a coil and a variable capacitance element, and a negative resistance circuit,
    a first resistor connected between the resonance circuit of said oscillation circuit section and a first one of a pair of terminals of a power supply, wherein said first resistor includes a plurality of resistance elements and a plurality of switch circuits, said switch circuits being individually controlled with a controlling signal between on and off to variably control the resistance value of said first resistor,
    a second resistor connected between the negative resistance circuit of said oscillation circuit section and a second one of the terminals of the power supply,
    wherein both of said first resistor and said second resistor have a variably controllable resistance value; and
    a detection circuit for detecting the amplitude of an oscillation output signal of said oscillation circuit section and variably controlling the resistance value of both of said first and second resistors.

11. A signal processing circuit, comprising:
    a voltage-controlled variable frequency oscillation circuit including:
      an oscillation circuit section including a resonance circuit which includes a coil and a variable capacitance element and a negative resistance circuit,
      (ii) a first resistor connected between said oscillation circuit section and a first one of a pair of terminals of a power supply,
      (iii) a second resistor connected between said oscillation circuit section and a second one of the terminals of the power supply; and
    a processing circuit configured to carry out a predetermined signal process using an oscillation frequency signal from said voltage-controlled variable frequency oscillation circuit,
    wherein both of said first and second resistors have a resistance value which is variably controlled with adjustment data,
    wherein both of said first resistor and said second resistor are formed from a plurality of resistance elements and a plurality of switch circuits, and said switch circuits are individually controlled between on and off to variably control the resistance value of said first and second resistors.

12. The signal processing circuit according to claim 11, wherein said signal processing circuit further comprises:
   storage means for storing adjustment data for the dispersion of the resistance value of both of said first and second resistors; and
   a circuit section configured to control the resistance value of both of said first and second resistors using the adjustment data stored in said storage means.

13. The signal processing circuit according to claim 12, wherein the power supply of said voltage-controlled variable frequency oscillation circuit provides a fixed voltage formed by a constant voltage circuit.

14. The signal processing circuit according to claim 11, wherein said signal processing circuit is a phase-locked loop circuit.

15. A signal processing circuit, comprising:
   a voltage-controlled variable frequency oscillation circuit including:
      an oscillation circuit section including a resonance circuit which includes a coil and a variable capacitance element and a negative resistance circuit;
      (ii) a first resistor connected between said oscillation circuit section and a first one of a pair of terminals of a power supply, wherein said first resistor includes a plurality of resistance elements and a plurality of switch circuits, said switch circuits being individually controlled with a controlling signal between on and off to variably control the resistance value of said first resistor;
      (iii) a second resistor connected between said oscillation circuit section and a second one of the terminals of the power supply; and
   a processing circuit configured to carry out a predetermined signal process using an oscillation frequency signal fom said voltage-controlled variable frequency oscillation circuit,
   wherein both of said first and second resistors have a resistance value which is variably controlled with adjustment data,
   wherein said resonance circuit includes a variable capacitance circuit whose capacitance is variably controlled in accordance with an oscillation frequency, and
   wherein the resistance value of both of said first and second resistors is varied in response to variation control of the capacitance in accordance with the oscillation frequency.

16. A signal processing circuit, comprising:
   a voltage-controlled variable frequency oscillation circuit including:
      an oscillation circuit section including a resonance circuit which includes a coil and a variable capacitance element and a negative resistance circuit;
      (ii) a first resistor connected between said oscillation circuit section and a first one of a pair of terminals of a power supply, wherein said first resistor includes a plurality of resistance elements and a plurality of switch circuits, said switch circuits being individually controlled with a controlling signal between on and off to variably control the resistance value of said first resistor;
      (iii) a second resistor connected between said oscillation circuit section and a second one of the terminals of the power supply; and
   a processing circuit configured to carry out a predetermined signal process using an oscillation frequency signal from said voltage-controlled variable frequency oscillation circuit,
   wherein both of said first and second resistors have a resistance value which is variably controlled with adjustment data; and
   a detection circuit for detecting the amplitude of an oscillation output signal of said oscillation circuit section and variably controlling the resistance value of both of said first and second resistors.

\* \* \* \* \*